US008699548B2

(12) United States Patent
Savoj et al.

(10) Patent No.: US 8,699,548 B2
(45) Date of Patent: Apr. 15, 2014

(54) LO GENERATION AND DISTRIBUTION IN A MULTI-BAND TRANSCEIVER

(75) Inventors: Jafar Savoj, Sunnyvale, CA (US); Babak Soltanian, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 265 days.

(21) Appl. No.: 12/948,166

(22) Filed: Nov. 17, 2010

(65) Prior Publication Data

US 2012/0120992 A1 May 17, 2012

(51) Int. Cl.
*H04B 1/38* (2006.01)

(52) U.S. Cl.
USPC .......................................... 375/219; 375/221

(58) Field of Classification Search
USPC ............ 375/200, 221, 219; 455/41.2; 331/74; 370/338
See application file for complete search history.

(56) References Cited

U.S. PATENT DOCUMENTS

| | | | | |
|---|---|---|---|---|
| 6,076,175 A | * | 6/2000 | Drost et al. .................... | 714/704 |
| 7,260,360 B2 | * | 8/2007 | Seo et al. ...................... | 455/41.2 |
| 7,321,268 B2 | * | 1/2008 | Chang et al. .................. | 331/37 |
| 8,180,311 B2 | * | 5/2012 | Behzad et al. ................ | 455/323 |
| 2003/0072389 A1 | | 4/2003 | Li et al. | |
| 2004/0036541 A1 | * | 2/2004 | Fang et al. ..................... | 331/74 |
| 2006/0135105 A1 | * | 6/2006 | Jensen .......................... | 455/260 |
| 2008/0079500 A1 | | 4/2008 | Rofougaran | |
| 2008/0139115 A1 | | 6/2008 | Roufoogaran et al. | |
| 2009/0156135 A1 | | 6/2009 | Kamizuma et al. | |
| 2012/0214429 A1 | * | 8/2012 | Goyal et al. .................. | 455/90.2 |

OTHER PUBLICATIONS

Zargari et al.: "A Dual-Band CMOS MIMO Radio SoC for IEEE 802.11n Wireless LAN", IEEE Journal of Solid-State Circuits, Dec. 2008, pp. 2882-2895, vol. 43, No. 12.
Razavi, "Design Considerations for Direct-Conversion Receivers", IEEE Transactions on Circuits and Systems—II: Analog and Digital Signal Processing, Jun. 1997, pp. 428-435, vol. 44, No. 6.
International Search Report and Written Opinion—PCT/US2011/061115—ISA/EPO—Jan. 31, 2012.

* cited by examiner

*Primary Examiner* — Shuwang Liu
*Assistant Examiner* — Helene Tayong
(74) *Attorney, Agent, or Firm* — Kenyon S. Jenckes

(57) ABSTRACT

A VCO of a PLL outputs a first differential signal of frequency FVCO. A first divide-by-two circuit local to the VCO divides the first differential signal and outputs a first quadrature signal of frequency FVCO/2. Two of the component signals of the first quadrature signal are routed to a second divide-by-two circuit local to a first mixer of a first device. The second divide-by-two circuit outputs a second quadrature signal of frequency FVCO/4 to the first mixer. All four signals of the first quadrature signal of frequency FVCO/2 are routed through phase mismatch correction circuitry to a second mixer of a second device. In one example, FVCO is a tunable frequency of about ten gigahertz, the first device is an IEEE802.11b/g transmitter or receiver that transmits or receives in a first band, and the second device is an IEEE802.11a transmitter or receiver that transmits or receives in a second band.

24 Claims, 16 Drawing Sheets

DIVIDE-BY-TWO CIRCUIT

OFFSET LO ARCHITECTURE

HETERODYNE ARCHITECTURE

HIGH LEVEL DIAGRAM OF
MULTI-BAND 802.11 TRANSCEIVER

TRANSCEIVER OF
MULTI-BAND 802.11 RADIO

LO GENERATION AND DISTRIBUTION
(SIMPLIFIED)

DIVIDE-BY-TWO CIRCUIT
LOCAL TO LOW BAND MIXERS

DIVIDE-BY-TWO CIRCUIT

TRANSPARENT LATCH

TRANSPARENT LATCH

TRACKING MODE
VOP = HIGH
VON = LOW

TRANSPARENT LATCH

LOCKING MODE
VOP = LOW
VON = HIGH

PROGRAMMABLE
DRIVER (PD)

PD1/2

PROGRAMMABLE DRIVER
(PD1/2)

| BLOCK NAME | SUB-BLOCK NAME | OFFSET LO OF FIG. 1 | HETERODYNE OF FIG. 2 | EMBODIMENT OF FIG. 6 |
|---|---|---|---|---|
| TOTAL AREA | | 0.752 | 0.676 | 0.444 |
| VCO | VCO CORE | 0.260 | 0.260 | 0.120 |
| | VCO BUFFER | 0.012 | 0.012 | 0.000 |
| LO | POLYPHASE FILTER | 0.030 | 0.000 | 0.000 |
| | OFFSET LO DIVIDER | 0.016 | 0.000 | 0.000 |
| | OFFSET LO MIXER | 0.096 | 0.000 | 0.000 |
| | POLY PHASE FILTER | 0.030 | 0.000 | 0.000 |
| | LO DIVIDER | 0.000 | 0.016 | 0.016 |
| | BUFFER | 0.012 | 0.012 | 0.012 |
| TX | FIRST MIXER | 0.220 | 0.048 | 0.220 |
| | SECOND MIXER | 0.000 | 0.220 | 0.000 |
| RX | FIRST MIXER | 0.076 | 0.076 | 0.076 |
| | SECOND MIXER | 0.000 | 0.032 | 0.000 |

NUMBERS IN SQUARE MILLIMETERS

AREA COMPARISON

FIG. 17

| BLOCK NAME | SUB-BLOCK NAME | OFFSET LO OF FIG. 1 | HETERODYNE OF FIG. 2 | EMBODIMENT OF FIG. 6 |
|---|---|---|---|---|
| TOTAL CURRENT | | 55.6 | 44.3 | 44.3 |
| VCO | VCO CORE | 4.0 | 7.1 | 7.1 |
| | VCO BUFFER | 5.5 | 0.0 | 0.0 |
| LO | POLYPHASE FILTER | 0.0 | 0.0 | 0.0 |
| | OFFSET LO DIVIDER | 0.0 | 0.0 | 0.0 |
| | OFFSET LO MIXER | 0.0 | 0.0 | 0.0 |
| | POLY PHASE FILTER | 0.0 | 0.0 | 0.0 |
| | LO DIVIDER | 4.5 | 0.0 | 12.6 |
| | BUFFER | 2.7 | 12.6 | 7.6 |
| TX | FIRST MIXER | 15.0 | 17.0 | 17.0 |
| | SECOND MIXER | 17.0 | 0.0 | 0.0 |

NUMBERS IN MILLIAMPERES AT 1.3 VOLTS

CURRENT CONSUMPTION COMPARISON

FIG. 18

LO GENERATION AND DISTRIBUTION IN A MULTI-BAND TRANSCEIVER

BACKGROUND

1. Technical Field

The present disclosure relates to the generation and distribution of local oscillator signals within a multi-band transceiver.

2. Background Information

Cellular telephone handsets are sometimes made to have a multi-band WiFi communication capability where the WiFi communication capability is to be compliant with multiple Institute of Electrical and Electronic Engineers (IEEE) standards including IEEE802.11a, IEEE802.11b, and IEEE802.11g. Due to the application in a cellular telephone handset, reducing the integrated circuit area consumed by the multi-band transceiver is important to reduce cost. Maintaining low power consumption is also important to increase talk time. If the multi-band transceiver is to operate in compliance with the IEEE802.11b and IEEE802.11g standards, then it should be able to receive and to transmit signals in the so-called 2.5 GHz band. This band actually extends from a lower bound of approximately 2.412 GHz to an upper bound of approximately 2.484 GHz. If the multi-band transceiver is to operate in compliance with the IEEE802.11a standard, then it should be able to receive and to transmit signals in the so-called 5.0 GHz band. This band actually extends from a lower bound of approximately 4.915 GHz to an upper bound of approximately 5.825 GHz.

The upconversion and downconversion processes that occur in the multi-band WiFi transceiver generally require both I and Q local oscillator signals in the frequency of the band of interest, where the I local oscillator signal is differential and where the Q local oscillator signal is differential. Accordingly, four phases (0, 90, 180, 270 degrees) of a first tunable quadrature local oscillator signal around 2.5 GHz are typically required for IEEE802.11b/g band operation, and four phases (0, 90, 180, 270 degrees) of a second tunable quadrature local oscillator signal around 5.0 GHz are typically required for IEEE802.11a band operation. These tunable local oscillator signals are typically generated using a Phase-Locked Loop (PLL) that in turn includes a Voltage Controlled Oscillator (VCO). For cost reasons, the PLL and VCO are realized on the same integrated circuit as are the Power Amplifiers (PAs) that output the high power signals to the transmitter antenna. Unfortunately, a strong transmitter output signal from a PA can be injected back such that it disturbs the VCO if the VCO is operating at the same approximate frequency as the PA output signal frequency. This disturbance of the VCO can be due to injection back into the VCO through the power supply conductors, through ground conductors, through the integrated circuit substrate, or due to inductive coupling between a PA coil and the coil of the VCO. To prevent such unwanted interaction between a PA output signal and the VCO, an architecture is typically employed in which the VCO does not operate at the same frequency as the frequency of the PA output signal. There are several architectures for accomplishing this.

A first architecture involves running the VCO in the ten gigahertz range and routing the VCO output signal to the transmitters and receivers. In the case of 5.0 GHz band transmitters and receivers that require quadrature local oscillator signals at 5.0 GHz, a circuit close to the transmitter or receiver receives the ten gigahertz signal and generates the 5.0 GHz quadrature local oscillator signal required. In the case of transmitters and receivers that require quadrature local oscillator signals at 2.5 GHz, a circuit close to the transmitter or receiver divides the ten gigahertz signal by four and generates the 2.5 GHz quadrature signal. This simple architecture is generally not used because it has a very high power consumption due to parasitics in the routing and because it suffers from reliability and yield problems due to the high frequency of operation in the LO distribution network.

FIG. 1 (Prior Art) is a diagram of a second architecture for generating the required local oscillator signals using a single local oscillator without the oscillator being unduly adversely affected by the power amplifier output signal. This architecture is sometimes referred to as the "offset LO" architecture. A VCO 1 outputs a differential signal of a frequency that is ⅔ the frequency of the desired PA output signal. The PA of an IEEE802.11a transmitter is identified by reference numeral 2. The VCO output signal is then divided down by two by a divider 3 to generate quadrature signals at ⅓ of the desired PA output frequency. A polyphase filter 4 is used to generate quadrature signals at ⅔ the desired PA output frequency. A mixer 5 mixes the quadrature signals of ⅔ the desired PA output frequency with the quadrature signals of ⅓ the desired PA output frequency to generate a differential signal 6 of the desired PA output frequency. A first polyphase filter 7 is used to generate the quadrature signals that are supplied to the mixer 8 of an IEEE802.11a transmitter 9 portion of the circuit. A second polyphase filter 10 is used to generate the quadrature signals that are supplied to the mixer 11 of an IEEE802.11a receiver 12 portion of circuit. By tuning the VCO output signal frequency in the range of from approximately 3.27 GHz to 3.88 GHz, the local oscillator signals supplied to the mixers 8 and 11 of the IEEE802.11a transmitter and the IEEE802.11a receiver can be set to have a desired frequency in a tuning range of from about 4.915 GHz to about 5.825 GHz as required for IEEE802.11a band operation.

To generate the quadrature local oscillator signals for IEEE802.11b/g band operation, an additional divide-by-two circuit 13 is provided. Divide-by-two circuit 13 generates quadrature signals at half the frequency of the signal output by mixer 5. These quadrature signals are provided to the mixer of an IEEE802.11b/g band transmitter (not shown), and are also provided to the mixer of an IEEE802.11b/g band receiver (not shown). The IEEE802.11b/g band transmitter can be considered to have the same topology as the transmitter 9. The IEEE802.11b/g band receiver can be considered to have the same topology as the receiver 12. By tuning the VCO frequency in a tuning range from 3.618 GHz to 3.726 GHz, the frequency of the local oscillator signals supplied to mixers of the IEEE802.11b/g band transmitter and the IEEE802.11b/g receiver can be set to have a desired frequency in a tuning range of from about 2.412 GHz to about 2.484 GHz as required for IEEE802.11b/g band operation. The "offset LO" architecture of FIG. 1 is desirable in that the VCO operates at a different frequency from the frequency of the transmitter output signal where this different frequency is not a multiple of the power amplifier output signal. This offset LO architecture, however, has drawbacks in that it is expensive to implement. It also exhibits fairly high current consumption. These two drawbacks make it undesirable for use in a cellular handset application.

FIG. 2 (Prior Art) is a third architecture for generating the required local oscillator signals for multi-band WiFi operation using a single local oscillator. This architecture is sometimes referred to as the "heterodyne LO" architecture. A VCO 14 outputs a signal at ⅔ the frequency of the desired PA output signal as in the case of the offset LO architecture, but in the case of the heterodyne LO architecture there are two cascaded mixers 15 and 16 in the transmit signal path of the IEEE802.11a transmitter 17 and there are two cascaded mixers 18 and 19 in the receive signal path of the IEEE802.11a receiver 20. In the case of the transmitter, the first mixer 15 upconverts by mixing the baseband signal to be transmitted with the quadrature signal 21 of ⅓ the desired PA output signal frequency. The second mixer 16 then further upconverts by mixing the output of the first mixer with the differential signal 22 of ⅔ of the desired PA output signal frequency as output by the VCO. The result of the cascaded mixing is the same as if a single upconverting mixer were used to mix the baseband transmit signal with a quadrature signal of the desired PA output signal frequency. The inverse process occurs in the IEEE802.11a receiver 20. Reference numeral 23 identifies the power amplifier of the IEEE802.11a transmitter 17.

To generate the quadrature local oscillator signals for IEEE802.11b/g band operation, an additional mixer 24 and a divide-by-two circuit 25 are provided as illustrated. The quadrature signals from divide-by-two circuit 25 are supplied to the mixer of a homodyne direct conversion transmitter (not shown). This transmitter is used for IEEE802.11b/g band transmitting. Similarly, the quadrature signals from divide-by-two circuit 25 are supplied to the mixer of a homodyne direct conversion receiver (not shown). This receiver is used for IEEE802.11b/g band receiving. By tuning the VCO frequency in the tuning range from 3.618 GHz to 2.726 GHz, the frequency of the local oscillator signals supplied to mixers of the IEEE802.1b/g transmitter and receiver can be set appropriately for IEEE802.11b/g band operation. In the heterodyne LO architecture of FIG. 2, the active PA outputs its powerful output signal at a frequency that is different from the VCO operating frequency. The VCO operates at a frequency that is not an even multiple of the PA output signal frequency and this reduces the unwanted influence of the PA output signal on the VCO. Unfortunately, the heterodyne LO architecture of FIG. 2 is also expensive to implement and has a relatively large current consumption. A further drawback is that signal quality may be compromised due to additional unwanted tones generated by the additional mixing circuitry involved.

SUMMARY

Within the local oscillator of a multi-band radio transceiver, a Voltage Controlled Oscillator (VCO) of a Phase-Locked Loop (PLL) outputs a first differential signal of a tunable frequency FVCO. In one example, this tunable frequency FCVO is close to the upper frequency limit that a VCO can be made to use and still have acceptable power consumption and reliability, given the semiconductor technology being used to implement the transceiver.

A first divide-by-two circuit local to the VCO divides this first differential signal of frequency FVCO by two and outputs a first quadrature signal of frequency FVCO/2. The first quadrature signal involves four component signals. Two of these four component signals are routed to a second divide-by-two circuit local to a first mixer of a first device. The second divide-by-two circuit outputs a second quadrature signal of frequency FVCO/4 to the first mixer. All four component signals of the first quadrature signal of frequency FVCO/2 are routed from the first divide-by-two circuit and through a first phase mismatch correction circuit to a second mixer of a second device. In one example, FVCO is a tunable frequency of about ten gigahertz, the first device is an IEEE802.11b/g transmitter or receiver that transmits or receives in a first frequency band (2.412 GHz to 2.484 GHz), and the second device is an IEEE802.11a transmitter or receiver that transmits or receives in a second frequency band (4.915 GHz to 5.825 GHz).

An on-chip internal test loop back connection is also provided. This test loop back connection allows the receiver on the chip for the second frequency band to receive and detect a signal output by the transmitter on the chip for the second frequency band. After the loop back signal has been received in this way and has been demodulated, evidence of phase mismatch in the components of the quadrature LO signals of the transmitter and/or receiver is detected. The first phase mismatch correction circuits in the quadrature LO signal paths going to the transmitter and/or receiver are then controlled so that the relative phases of the component signals are adjusted such that the detected phase mismatch is reduced or eliminated.

In addition to the circuitry described above involving two devices, two of the four component signals of the first quadrature signal are also routed to a third divide-by-two circuit local to a third mixer of a third device. The third divide-by-two circuit outputs a third quadrature signal of frequency FVCO/4 to the third mixer. All four component signals of the first quadrature signal of frequency FVCO/2 are also routed from the first divide-by-two circuit and through a second phase mismatch correction circuit to a fourth mixer of a fourth device. In one example, the third device is an IEEE802.11b/g receiver that receives in the first frequency band and the fourth device is an IEEE802.11a receiver that receives in the second frequency band. The VCO, the first divide-by-two circuit, the second divide-by-two circuit, the third divide-by-two circuit, the first phase mismatch correction circuit, the second phase mismatch correction circuit, the first device, the second device, the third device and the fourth device are all disposed on the same integrated circuit die.

Note that the lower 2.412 GHz bound of the first frequency band is approximately half the frequency of the lower 4.915 GHz bound of the second frequency band, and note that the upper 2.484 GHz bound of the first frequency band is approximately half of the frequency of the upper 5.825 GHz bound of the second frequency band. The novel LO generation and distribution architecture set forth here takes special advantage of this fact, taken together with the fact that twice the frequency of the upper bound of the higher frequency band is about ten gigahertz and this high frequency is the highest frequency that a suitable VCO can be made to operate at with reasonable power consumption and reliability for the cellular telephone handset application. Although the VCO operates at a tunable frequency of approximately ten gigahertz, high frequency ten gigahertz signals are not routed over substantial distances across the die from the VCO to the first, second, third or fourth devices. Where 2.5 GHz quadrature signals are required, two component signals of the 5.0 GHz quadrature signal are routed as a differential signal over the substantial distance and the needed 2.5 GHz quadrature signals are generated close to where the quadrature signals are needed using a divide-by-two circuit. Where 5.0 GHz quadrature signals are required, the four component signals of the 5 GHz quadrature signal are routed over the substantial distance to the circuit that needs the 5.0 GHz quadrature signal, but phase mismatch correction circuitry is used to correct phase mismatch problems that might arise due to communicating the 5.0 GHz quadrature signal that distance.

The coupling gain of signals into the tank of the VCO is made to drop off rapidly for signals above ten gigahertz so that any harmonics of Power Amplifier (PA) output signals above ten gigahertz will not unduly perturb VCO operation. Even order harmonics of the 5.0 GHz and 2.5 GHz PA output signals may land on the ten gigahertz operating frequency of the VCO, but they have little impact on VCO operation due to their relative low strengths (as compared to the signal strengths of odd order harmonics) and due to the differential nature of the routing circuitry. As compared to offset LO architecture of the prior art and as compared to the heterodyne LO architecture of the prior art, the novel LO generation and distribution circuitry described above can be realized in a comparatively small amount of integrated circuit area and can be made to have a comparatively small current consumption.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 17 is a table that compares the amount of integrated circuit area required to implement the offset LO architecture of FIG. 1, the heterodyne LO architecture of FIG. 2, and the embodiment of FIG. 6.

FIG. 18 is a table that compares the current consumption of the offset LO architecture of FIG. 1, the heterodyne LO architecture of FIG. 2, and the embodiment of FIG. 6.

DETAILED DESCRIPTION

Figure 3:
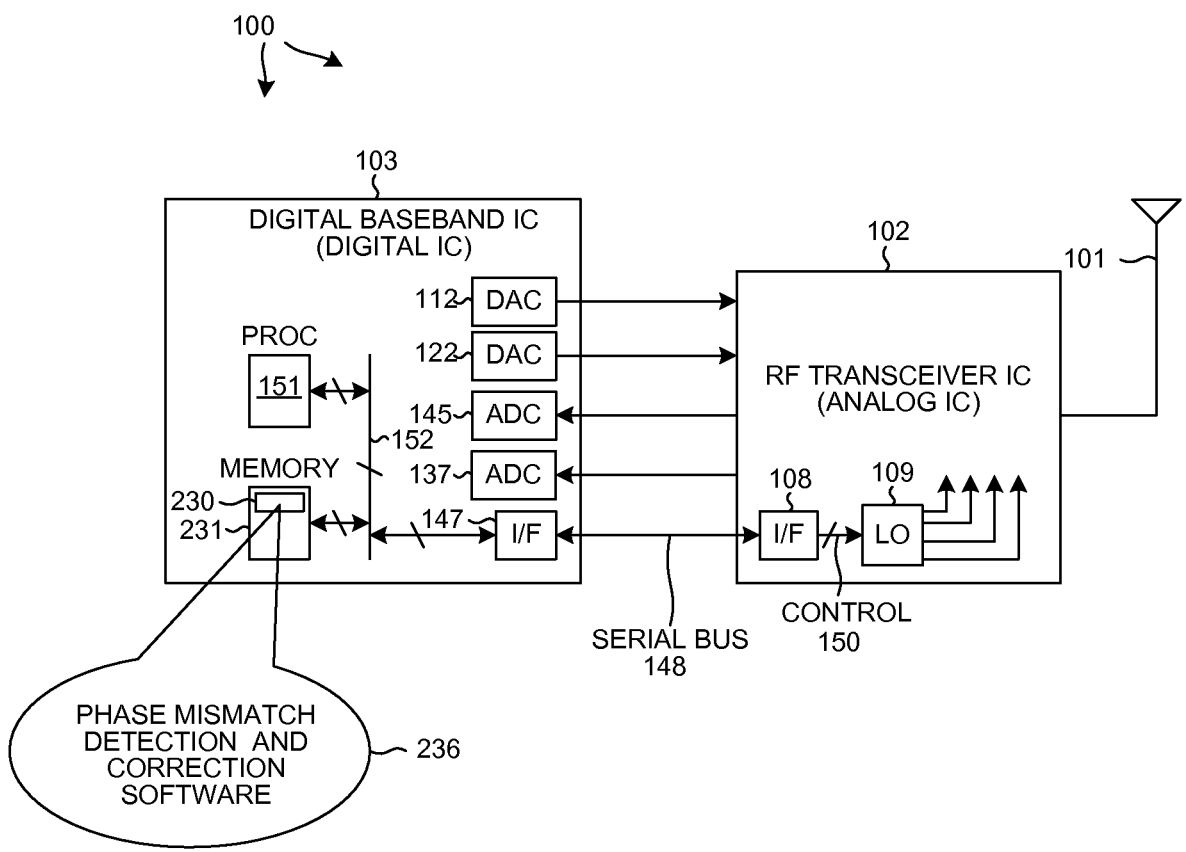
FIG. 3 is a high-level diagram of a multi-band IEEE802.11 transceiver that employs a divide-by-two LO generation and distribution architecture in accordance with one novel aspect.

FIG. 3 is a diagram of a multi-band IEEE802.11 mobile station device (STA) 100 transceiver embodied in a cellular telephone handset. The IEEE802.11 transceiver is called "multi-band" in that it can operate in accordance with the IEEE802.11a standard using a frequency band from 4.915 GHz to 5.825 GHz or it can operate in accordance with the IEEE802.11b/g standard using a frequency band from 2.412 GHz to 2.484 GHz. For simplification purposes, the lower band from 2.412 GHz to 2.484 GHz band is referred to hereinafter as the "first frequency band" and the higher band from 4.915 GHz to 5.825 GHz is referred to hereinafter as the "second frequency band". IEEE802.11b/g is referred to as the "first standard". IEEE802.11a is referred to as the "second standard". Transceiver 100 includes (among other parts not illustrated) an antenna 101, an RF transceiver integrated circuit 102, and a digital baseband integrated circuit 103. RF transceiver integrated circuit 102 is called a "transceiver" because it includes both transmitter circuitry as well as receiver circuitry.

Figure 4:
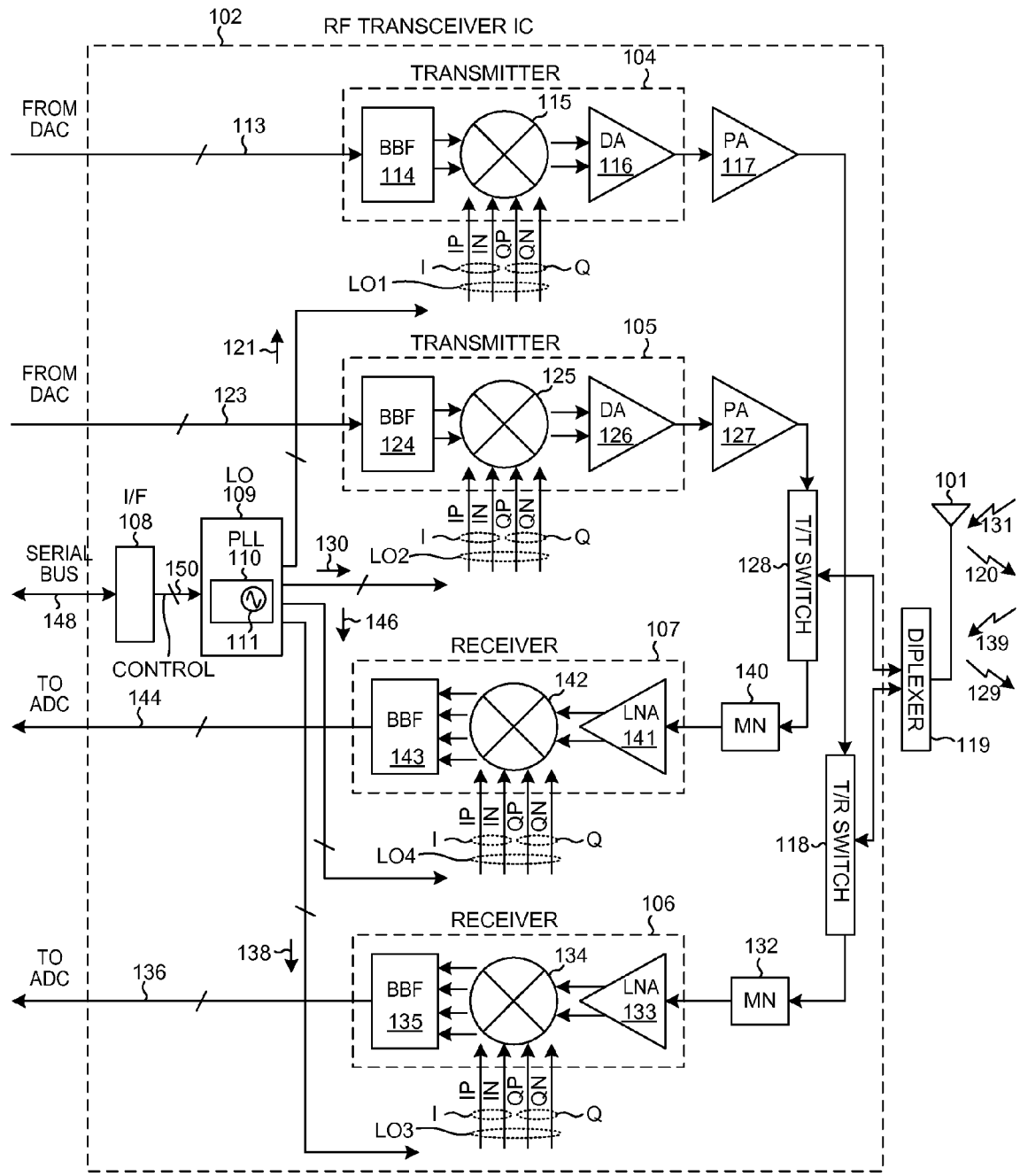
FIG. 4 is a diagram of the RF transceiver integrated circuit of FIG. 3.

FIG. 4 is a more detailed block diagram of the RF transceiver integrated circuit 102 of FIG. 3. The transceiver includes a first transmitter 104 for transmitting signals compliant with the first standard, a second transmitter 105 for transmitting signals compliant with the second standard, a first receiver 106 for receiving signals compliant with the first standard, and a second receiver 107 for transmitting signals compliant with the second standard. Transmitter 104 and receiver 106 are used when the mobile station 100 is communicating using the first standard, whereas transmitter 105 and receiver 107 are used when the mobile station is communicating using the second standard. In addition to the transmitters and receivers, the RF transceiver integrated circuit 102 includes serial bus interface circuitry 108, local oscillator circuitry 109, two power amplifiers 117 and 127, and two transmit/receive switches 128 and 118. The local oscillator circuitry 109 includes a Phase-Locked Loop (PLL) 110 that in turn includes a Voltage Controlled Oscillator (VCO) 111.

If mobile station 100 is transmitting a signal in accordance with the first standard, then information to be transmitted is converted into analog form by a Digital-to-Analog Converter (DAC) 112 (see FIG. 3) in the digital baseband integrated circuit 103 and is supplied via conductors 113 to transmitter 104. Baseband filter 114 filters out noise due to the digital-to-analog conversion process. Mixer 115 under control of local oscillator 109 then up-converts the signal into a high frequency signal. Driver amplifier 116 and power amplifier 117 amplify the high frequency signal. The resulting signal passes through T/R switch 118 and diplexer 119 to antenna 101 so that a high frequency RF signal 120 is transmitted from antenna 101. The control signals that control the T/R switches 118 and 128 are omitted from the diagram. Driver amplifier 116 in this case is a power amplifier from the perspective of outputting a signal of such power that preventing the output signal from perturbing VCO operation in the LO is of importance. The digital baseband integrated circuit 103 controls the transmitter 104 by controlling the frequency of a local oscillator quadrature signal LO1 121 supplied to mixer 115. LO1 in this case includes a differential I signal involving signals IP and IN, as well as a differential Q signal involving signals QP and QN.

If mobile station 100 is transmitting a signal in accordance with the second standard, then information to be transmitted is converted into analog form by DAC 122 in the digital baseband integrated circuit 103 and is supplied via conductors 123 to transmitter 105. Baseband filter 124 filters out noise due to the digital-to-analog conversion process. Mixer 125 under control of local oscillator 109 then up-converts the signal into a high frequency signal. Driver amplifier 126 and power amplifier 127 amplify the high frequency signal. The high frequency signal passes through T/R switch 128 and diplexer 119 to antenna 101 so that a high frequency RF signal 129 is transmitted from antenna 101. Driver amplifier 126 is a power amplifier. The digital baseband integrated circuit 103 controls the transmitter 105 by controlling the frequency of a local oscillator signal LO2 130 supplied to mixer 125.

When mobile station 100 is receiving a signal in accordance with the first standard, a high frequency RF signal 131 is received on antenna 101. Information from signal 131 passes through diplexer 119, T/R switch 118, matching network 132, and through the receiver 106. The signal is amplified by Low Noise Amplifier (LNA) 133 and is down-converted in frequency by mixer 134. The resulting down-converted signal is filtered by baseband filter 135 and is passed to the digital baseband integrated circuit 103 via conductors 136. An Analog-to-Digital Converter (ADC) 137 in the digital baseband integrated circuit 103 converts the signal into digital form and the resulting digital information is processed by digital circuitry in the digital baseband integrated circuit 103. The digital baseband integrated circuit 103 tunes the receiver 106 by controlling the frequency of the Local Oscillator signal (LO3) 138 supplied to mixer 134.

If mobile station 100 is receiving a signal in accordance with the second standard, then a high frequency RF signal 139 is received on antenna 101. Information from signal 139 passes through diplexer 119, T/R switch 128, matching network 140, and through the receiver 107. The signal is amplified by LNA 141 and is down-converted in frequency by mixer 142. The resulting down-converted signal is filtered by baseband filter 143 and is passed to the digital baseband integrated circuit 103 via conductors 144. An ADC 145 in the digital baseband integrated circuit 103 converts the signal into digital form and the resulting digital information is processed by digital circuitry in the digital baseband integrated circuit 103. The digital baseband integrated circuit 103 tunes the receiver 107 by controlling the frequency of the Local Oscillator signal (LO4) 146 supplied to mixer 142.

A processor 151 in digital baseband integrated circuit 103 controls local oscillator 109 and the frequencies of LO signals 121, 130, 138 and 146 by sending appropriate control information to the RF transceiver integrated circuit 102 via bus mechanism 152, serial bus interface 147, across a serial bus 148, through serial bus interface 108, and control lines 150. Processor 151 accesses and executes program 230 of processor-executable instructions stored in semiconductor memory 231. Semiconductor memory 231 is a processor-readable medium that is accessible by processor 151 via bus mechanism 152.

Figure 5:
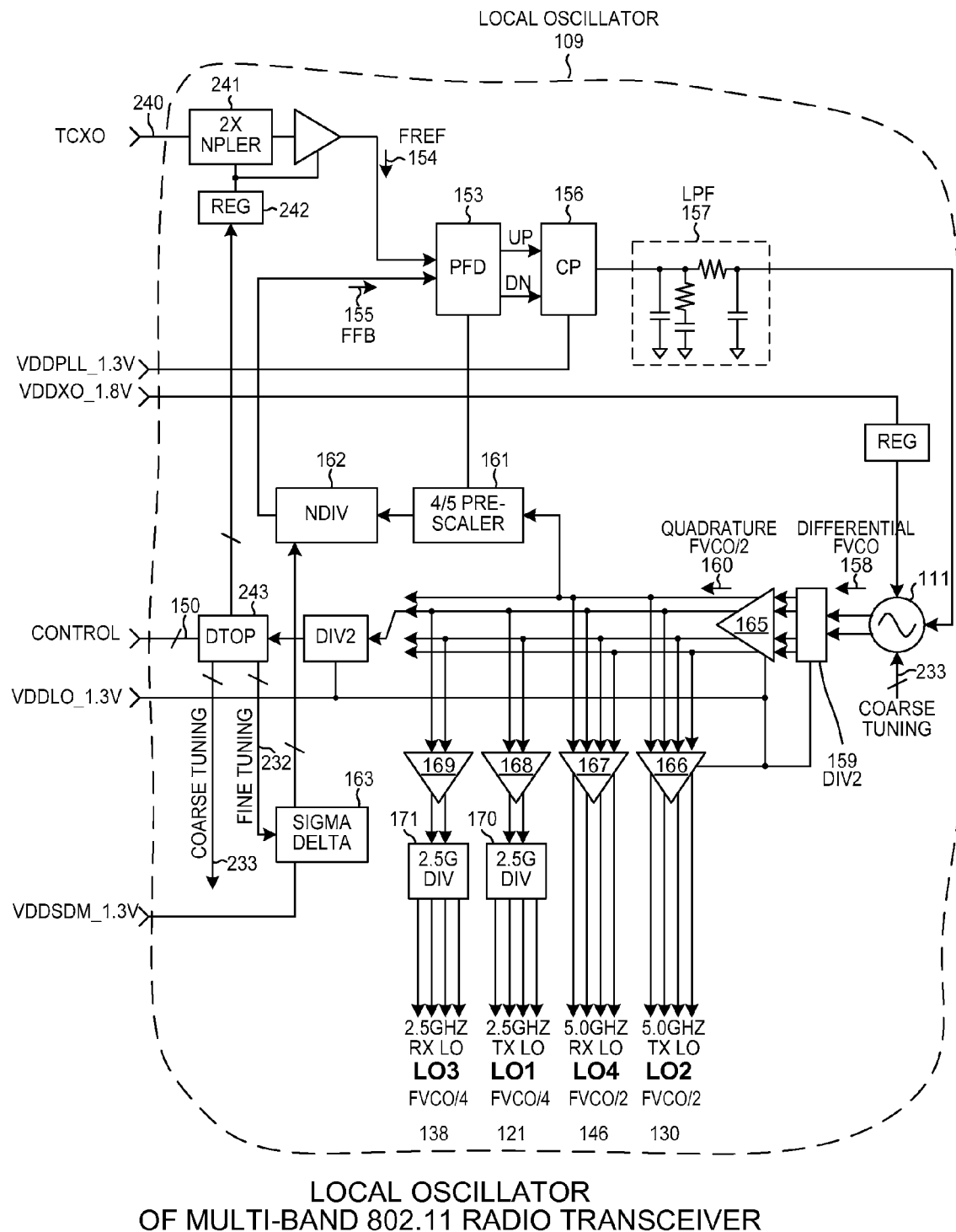
FIG. 5 is a diagram of the local oscillator within the RF transceiver integrated circuit of FIG. 4.

FIG. 5 is a more detailed diagram of local oscillator 109. A Phase-Frequency Detector (PFD) 153 compares the phase of a frequency reference clock signal FREF 154 to the phase of a feedback clock signal FFB 155 and outputs up and down phase error pulse signals UP and DN. Change pump 156 and Low Pass Loop Filter (LPF) 157 convert the error pulses into a relatively slowly changing error voltage. This error voltage is supplied onto the fine tuning input lead of VCO 111. VCO 111 outputs a differential signal 158 of a frequency that corresponds to the level of the error voltage. Differential signal 158 includes two signals of the same frequency FVCO but with relative phases of 0 degrees and 180 degrees. A divide-by-two circuit 159 divides the differential signal 158 by two and outputs a quadrature signal 160 of frequency FVCO/2. The quadratrue signal 160 includes four signals of the same frequency but with relative phases of 0 degrees, 90 degrees, 180 degrees, and 270 degrees. The zero degree phase signal is divided by prescaler 161, and then is further divided down by loop divider 162 to generate the feedback clock signal FFB 155. How loop divider 162 divides is controlled by a sigma delta modulator 163. The PLL is tuned by changing the multi-bit digital control value loaded into DTOP block 243 via conductors 150 and serial bus 148. The DTOP block 243 supplies a fine tuning digital control value to the sigma delta modulator 163 via conductors 232 and supplies a coarse tuning digital control value to the VCO 111 via conductors 233. Buffer 165 may be considered an output buffer portion of divide-by-two circuit 159. The triangle buffer symbols 166-169 are high-level symbols. For more detail on the actual circuitry represented by these high-level symbols 165-169, see FIG. 6 and the following text. Blocks 170 and 171 represent divide-by-two circuits. Each of these divide-by-two circuits receives a differential signal of a given frequency and outputs quadrature signals of half that frequency. Quadrature signals LO1, LO2, LO3 and LO4 are supplied to transmitter 104, transmitter 105, receiver 106 and receiver 107, respectively. A crystal clock signal TCXO from a crystal clock signal source XTAL/SRC 234 (such as a crystal oscillator) is received via conductor 240 and is supplied to a frequency doubler 241. Whether doubler 241 doubles the frequency of the crystal clock signal or not is determined by digital control information stored in register 242 as determined by control information received via serial bus 148 and the DTOP logic block 243.

Figure 6:
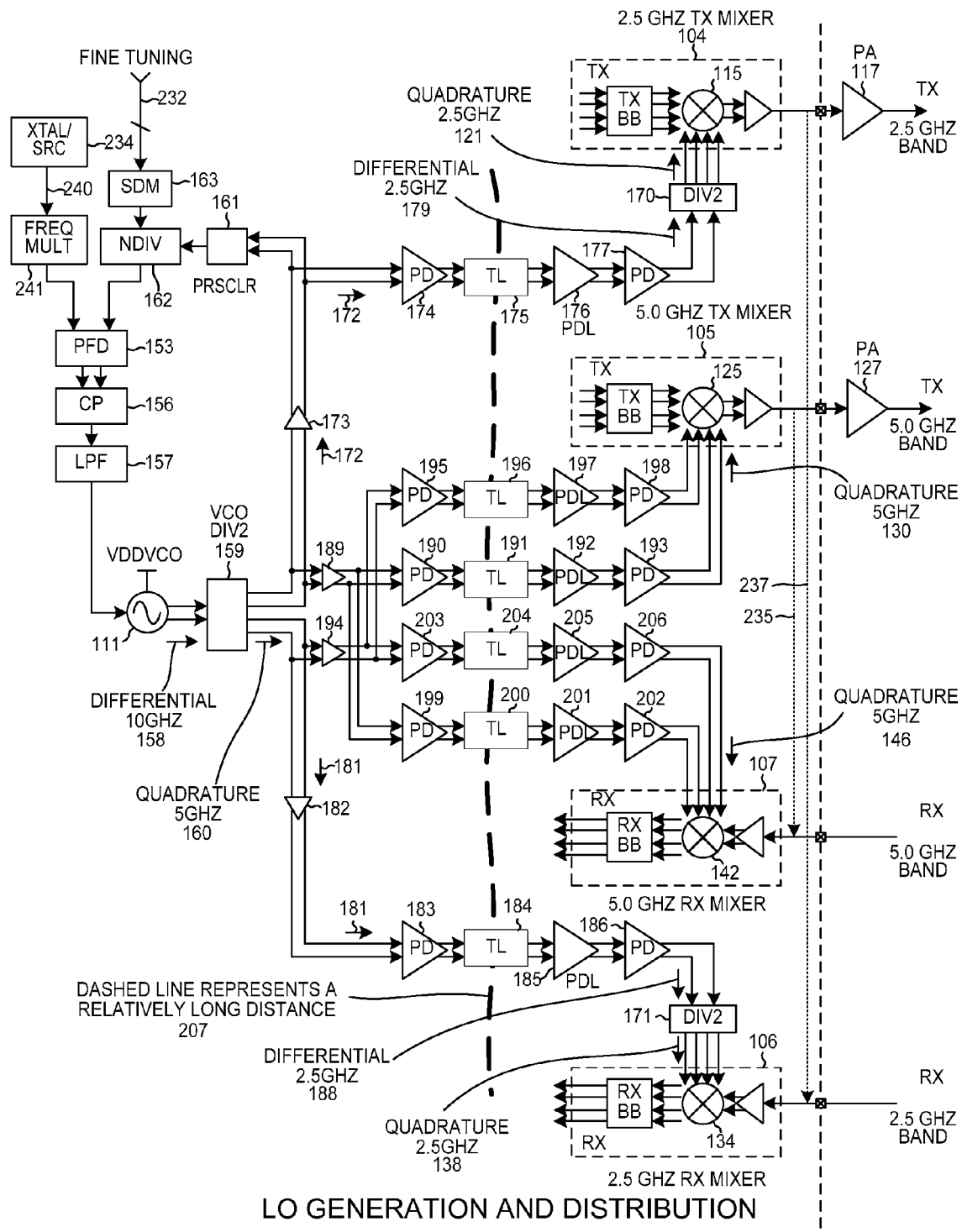
FIG. 6 is a more detailed diagram of the LO generation and distribution circuitry within the RF transceiver integrated circuit of FIG. 4.

FIG. 6 is a diagram that shows the LO signal generation and distribution circuitry in more detail. VCO 111 is controlled to generate and output the differential signal 158 at about 10 GHz. This 10 GHz VCO frequency is four times the desired local oscillator signal frequency used by the transmitter or receiver if the transceiver is to be operating in the first frequency band (IEEE802.11b/g) and is two times the desired local oscillator signal frequency used by the transmitter or receiver if the transceiver is to be operating in the second frequency band (IEEE802.11a).

Unlike the first architecture described above in the background section, this 10 GHz VCO signal is not routed large distances across the integrated circuit. At a location very close to VCO 111, the divide-by-two circuit 159 receives the differential signal VCO 158 and divides it down in frequency by two, and outputs quadrature signal 160 of half the frequency of signal 158. Quadrature signal 160 comprises four component signals of different phases (0, 90, 180, 270 degrees) but of the same frequency. Two of the four component signals of the resulting quadrature signal 160 can be considered together to be a differential signal. Two of the four component signals are routed as a differential signal 172 via buffer 173 and phase correcting circuitry 174-177 to the divide-by-two circuit 170 located close to mixer 115 of transmitter 104. The divide-by-two circuit 170 receives the phase corrected version 179 of the differential signal, divides it down in frequency by two, and generates the quadrature signal 121 of a frequency of half the frequency of signal 179.

Similarly, two others of the four component signals of quadrature signal 160 can be considered together to be a differential signal. These two signals are routed as a differential signal 181 via buffer 182 and phase correcting circuitry 183-186 to the divide-by-two circuit 171 located close to mixer 134 of transmitter 106. The divide-by-two circuit 171 receives the phase corrected version 188 of the differential signal, divides it down in frequency by two, and generates the quadrature signal 138 of a frequency of half the frequency of signal 188. To cover the first band (IEEE802.11b/g) that extends from 2.412 GHz to 2.484 GHz, the VCO 111 is tunable to output VCO output signal 158 in the range of from 9.648 GHz to 9.936 GHz.

For the transmitter and receiver of the second band (IEEE802.11a), the 5.0 GHz quadrature local oscillator signal 160 is routed from the output of divide-by-two circuit 159 to the mixers 125 and 142. Because the relative phases of the four component signals making up this quadrature signal 160 can be disturbed or changed when the quadrature signal is routed over such a long distance, phase mismatch correction circuitry is employed to correct the relative phases of the component signals relative to one another so that the phases are correct when the quadrature signal is supplied to the mixers 125 and 142. For example, the phase mismatch corrected quadrature signal 130 supplied to mixer 125 of transmitter 105 is communicated from divider 159 via two phase mismatch correction circuits. Two of the component signals making up quadrature signal 160 pass through a buffer 189 and phase mismatch correction circuitry 190-193 before being supplied to mixer 125. Two others of the component signals making up quadrature signal 160 pass through a buffer 194 and phase mismatch correction circuitry 195-198 before being supplied to mixer 125. The phase mismatch corrected quadrature signal 146 supplied to mixer 142 of receiver 107 is communicated from divider 159 via two other phase mismatch correction circuits. The two of the component signals making up quadrature signal 160 that pass through buffer 189 are made to pass through phase mismatch correction circuitry 199-202 before being supplied to mixer 142. The two of the component signals making up quadrature signal 160 that pass through buffer 194 are made to pass through phase mismatch correction circuitry 203-206 before being supplied to mixer 142. The dark dashed vertical line 207 in FIG. 6 represents a relatively long distance of routing of more than one hundred microns. Divider 159, by contrast, is located relatively close to (less than fifty microns from) VCO 111. Similarly, divider 170 is located relatively close to (less than fifty microns from) mixer 115 and divider 171 is located relatively close to (less than fifty microns from) mixer 134.

Although VCO 111 is operating at a high frequency (approximately 10 GHz) that is an integer multiple of the PA output signal frequency (approximately 5.0 GHz or approximately 2.5 GHz), the integer multiple is an even integer such as two or four. When the harmonic content of a PA output signal is analyzed, the odd order harmonic signal content is generally relatively stronger, whereas the even order harmonic signal content is generally relatively weaker. Although there is a fourth order harmonic of the 2.5 GHz PA output signal at 10 GHz that would affect a VCO tuned and operating at 10 GHz, and although there is a second order harmonic of the 5.0 GHz PA output signal at 10 GHz that would affect with a VCO tuned and operating at 10 GHz, the fact that these harmonics are even order harmonics means that they are of relatively weak signal strength and consequently tend not to affect VCO operation to a large degree. Stronger odd order harmonics in the PA output signal are stronger, but these odd order harmonics are not at 10 GHz so coupling into the VCO that is tuned to operate at 10 GHz is relatively small. The affect of even order harmonics in the PA output signal is still further reduced due to the differential signal routing employed. The VCO is designed such that coupling gain of signals above 10 GHz back into the tank of the VCO drops off quickly for frequencies above 10 GHz. This helps further reduce the impact of any PA output signal harmonics that have frequencies greater than 10 GHz (for example, a fifth order harmonic of a 2.5 GHz PA output signal fundamental or a third order harmonic of a 5.0 GHz PA output signal fundamental) on 10 GHz VCO operation.

Figure 7:
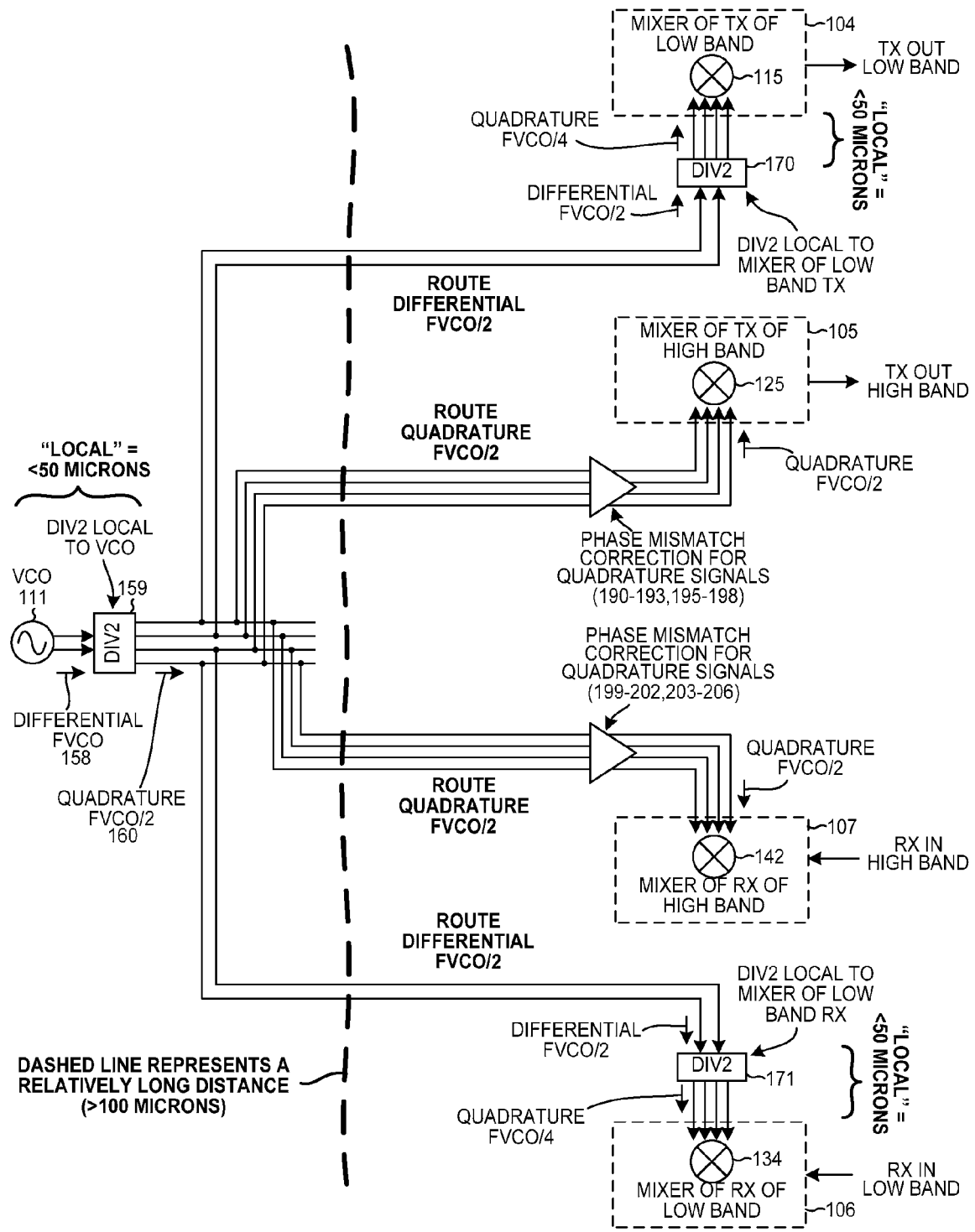
FIG. 7 is a simplified diagram of the LO generation and distribution circuitry within the RF transceiver integrated circuit of FIG. 4.

FIG. 7 is a simplified diagram of the LO generation and distribution circuitry of FIG. 6. The VCO divide-by-two circuit 159 is located close to the VCO 111 to generate a quadrature signal of frequency FVCO/2 from the VCO differential output signal 158 of frequency FVCO. For the transmitter and receiver of the lower frequency band (the first band), differential signals of a higher frequency than is needed (FVCO/2) are routed from the VCO's divider 159 to the transmitter and receiver, and then divide-by-two circuits (170, 171) are used locally to generate the needed quadrature signals of frequency FVCO/4 from the differential signals. The differential signals of frequency FVCO/2 may be routed from VCO divider 159 to the local divide-by-two circuits 170 and 171 via buffers, line drivers, and/or phase-mismatch correction circuitry.

For the transmitter and receiver of the higher frequency band (the second band), quadrature signals of the desired frequency (FVCO/2) are routed as quadrature signals from the VCO divide-by-two circuit 159 to the transmitter and receiver without local divide-by-two circuitry. Phase mismatch correction circuitry (190-193,195-198,199-202,203-206) in the signal path of the quadrature signals corrects any phase mismatch that may be introduced in the component signals of the quadrature signals due to the long distance of routing. The quadrature signals of frequency FVCO/2 may be routed from VCO divider 159 to the transmitter 105 and receiver 107 via buffers, line drivers and/or the phase-mismatch correction circuitry.

Figure 8:
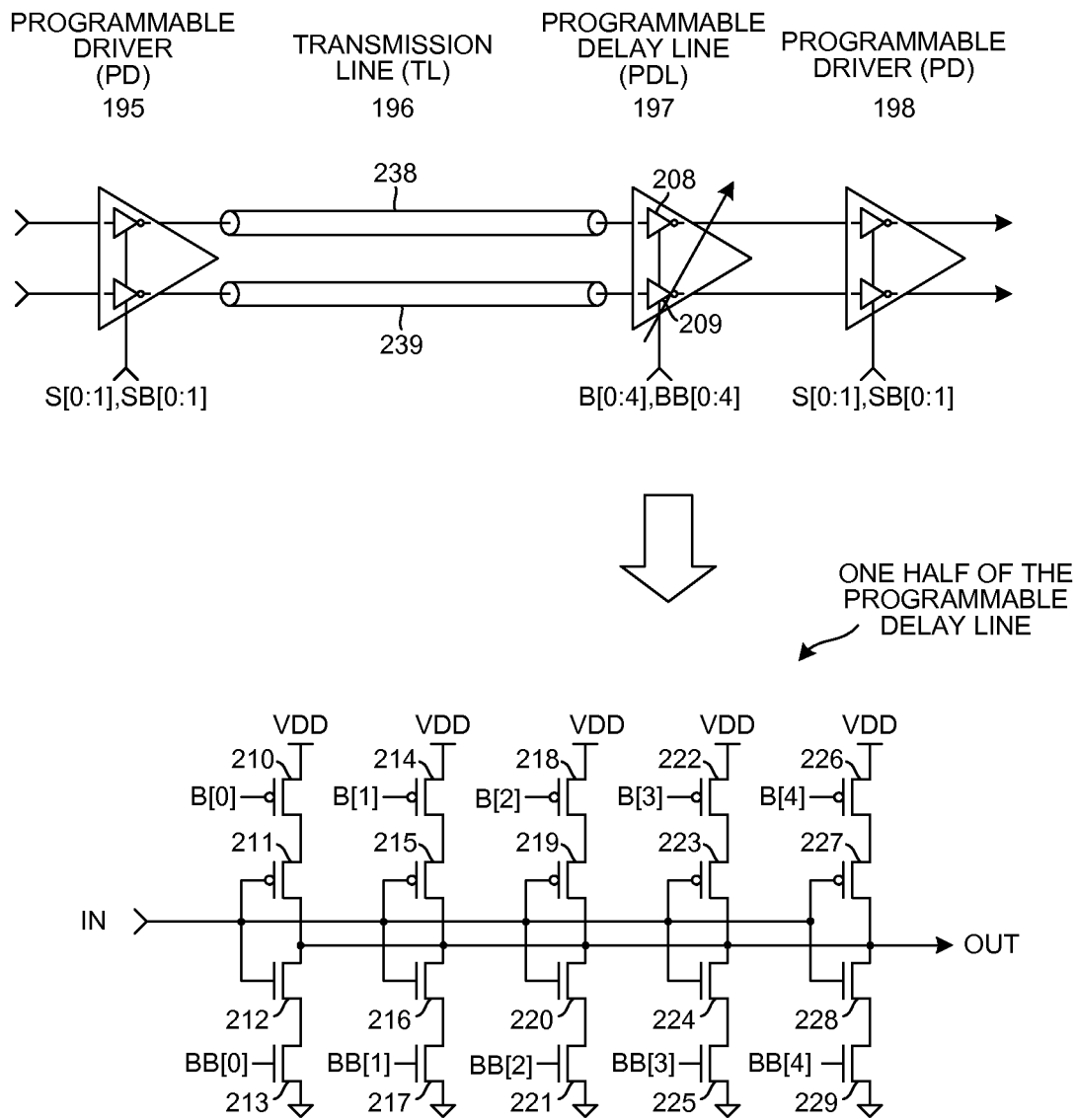
FIG. 8 is a diagram of one of the programmable delay lines in the LO generation and distribution circuitry of FIG. 6.

FIG. 8 is a diagram of one instance of phase mismatch correction circuitry 195-198. There are five other instances of this circuitry in the distribution circuitry of FIG. 7. The phase mismatch correction circuitry 195-198 includes a first Programmable Driver (PD) 195, a Transmission Line (TL) 196, a Programmable Delay Line (PDL) 197, and a second Programmable Driver (PD) 198. Transmission line 196 includes two lengths of metal conductors 238 and 239. Each of these metal conductors is a single contiguous length of metal that has a controlled and substantially uniform impedance.

Programmable Delay Line 197 includes two sets of inverters. The first set of these inverters is represented by the inverter symbol 208. The second set of these inverters is represented by the inverter symbol 209. Each of these sets of inverters is a set of parallel-connected CMOS inverters, where individual ones of the inverters can be enabled or disabled by digital control signals B[0-4] and BB[0-4]. One of these sets of the inverters 210-229 is illustrated in the bottom portion of FIG. 8. By adjusting the relative drive strength of the programmable delay lines (PDL) in the signal propagation delay paths of the component signals of a quadrature signal, the relative phases of the component signals are adjusted so that the phases are at their correct 0, 90, 180 and 270 degrees values at the location where the quadrature signal is to enter a mixer.

In one example, an internal loop back test connection 235 is used so that receiver 107 can be used to receive a signal output by transmitter 105. The signal is received through the RF transceiver integrated circuit 102, and after downconversion and filtering is supplied via conductors 144 to ADC 145 in the digital baseband integrated circuit 103. ADC 145 digitizes the signal and the signal is demodulated. Phase mismatched detection and correction software 236 and processing then determines whether there is unwanted content in the demodulated output. If unwanted content is detected and this unwanted content is determined to be due to I/Q phase mismatch, then the phase mismatch detection and correction software causes the phase mismatch correction circuitry 195-198 and 190-193 supplying the I and Q signals to the transmitter 105 change the relative phases between I and Q. The phase mismatch detection and correction mechanism again uses receiver 107 to monitor the transmission. The I and Q phases are adjusted until the unwanted content in the demodulated signal is no longer present. For additional details on a suitable phase mismatch detection and correction process, see: Behzad Razavi, "Design Consideration for Direct-Conversion Receivers", IEEE Transactions On Circuits and Systems—II: Analog and Digital Signal Processing, Vol. 44, No. 6, pages 428-435 (June 1997). I/Q mismatches in both the signal LO4 supplied to receiver 107 as well as in signal LO2 supplied to the transmitter 105 are corrected in this way. Reference numeral 237 identifies a second internal loop back test connection usable to perform I/Q mismatch correction on local oscillator signals LO3 and LO1.

Figure 9:
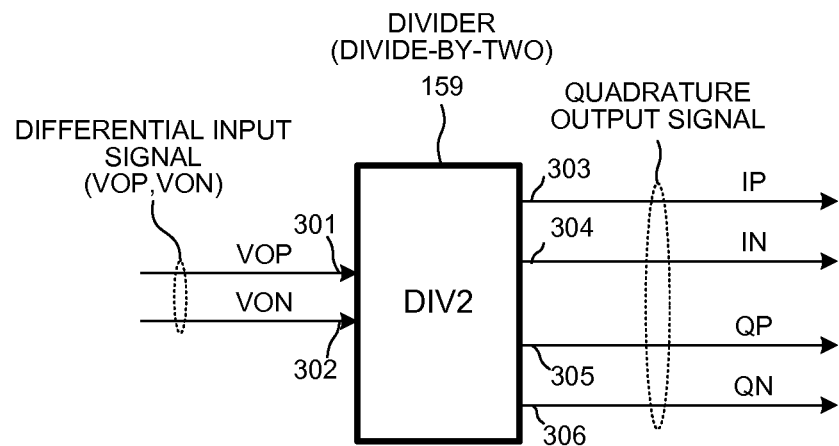
FIG. 9 is a high-level diagram of one of the divide-by-two circuits in the LO generation and distribution circuitry of FIG. 6.

FIG. 9 is a diagram of one of the divide-by-two circuits, divider 159. Divide-by-two circuits 170 and 171 are of identical construction. Divide-by-two circuit 159 receives a differential signal on input leads 301 and 302. Divide-by-two circuit 159 outputs a quadrature signal of half the frequency of the input signal on output leads 303-306.

Figure 10:
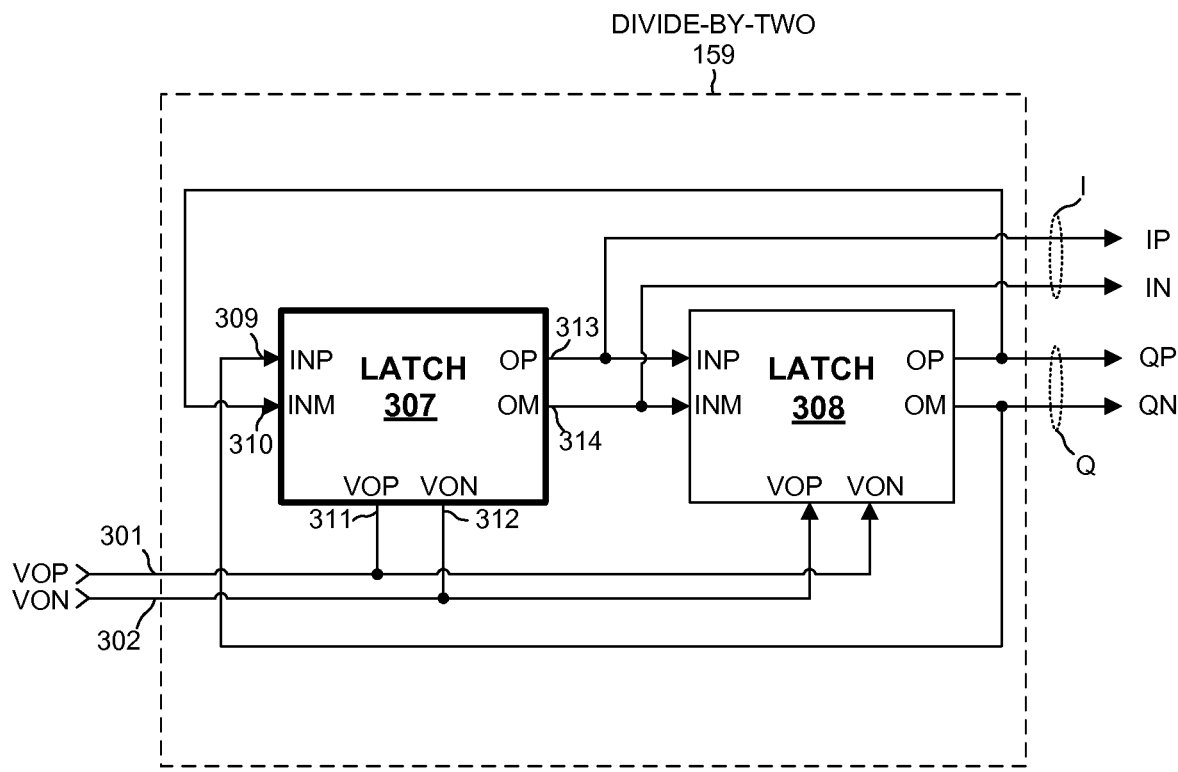
FIG. 10 is a more detailed diagram of the divide-by-two circuit of FIG. 9.

FIG. 10 is a more detailed diagram of the divide-by-two circuit 159. The divide-by-two circuit 159 includes two latches 307 and 308 coupled together as illustrated. As the input clock signal VOP/VON transitions, the first latch 307 is made to operate in the tracking mode and the second latch 308 is made to operate in the locking mode, and then when the input clock signal VOP/VON transitions again the first latch 307 is made to operate in the locking mode and the second latch 308 is made to operate in the tracking mode. In this way, the pair of latches operates as a toggle flip-flop and frequency divides by two.

Figure 11:
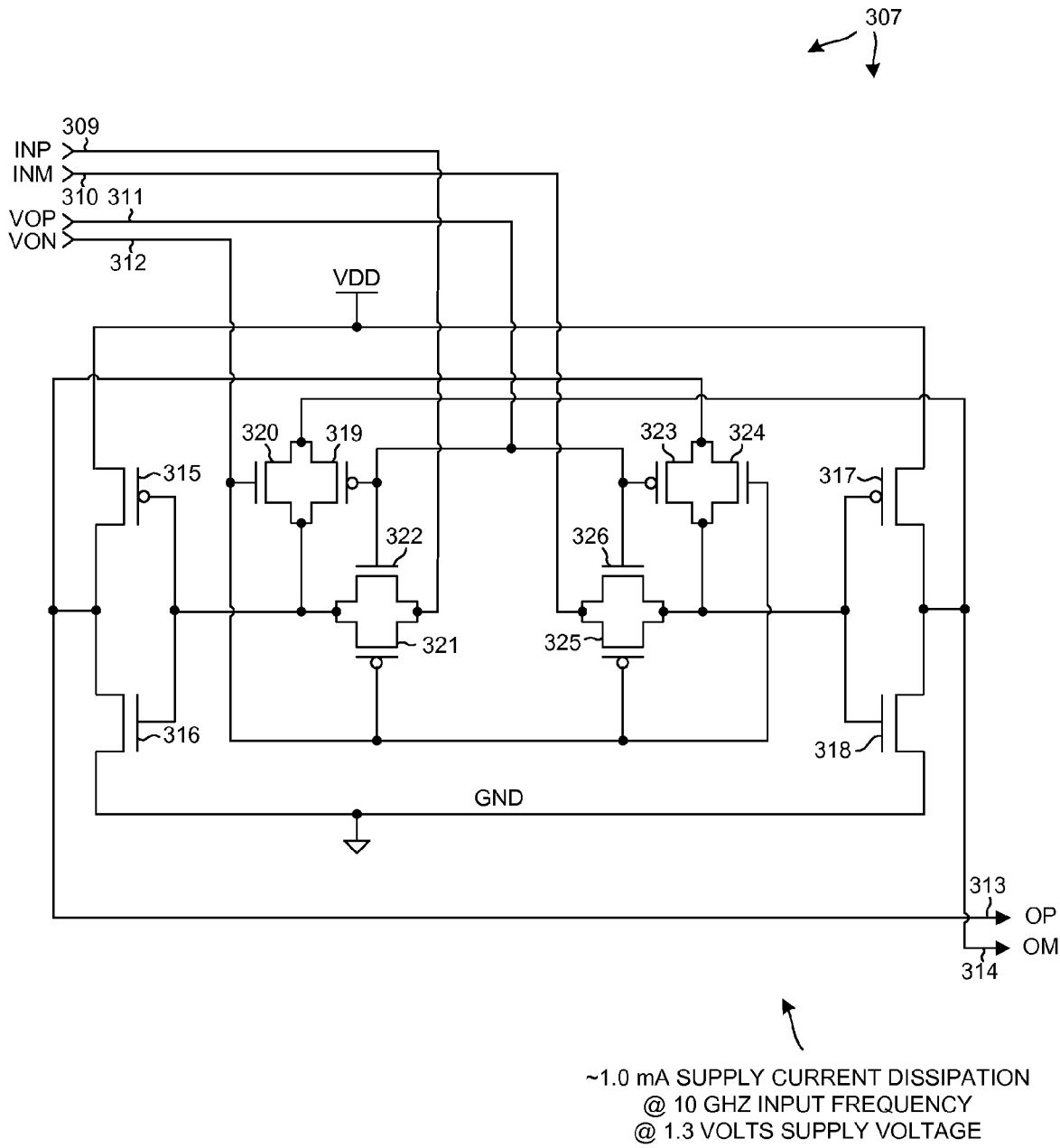
FIG. 11 is a circuit diagram of one of the latches of the divide-by-two circuit of FIG. 9.

FIG. 11 is a more detailed diagram of one of the latches 307. The latch 307 has two data input leads 309 and 310, two data output leads 313 and 314, and two clock input leads 311 and 312. The latch includes a first inverter including transistors 315 and 316, a second inverter including transistors 317 and 318, a first transmission gate including transistors 319 and 320, a second transmission gate including transistors 321 and 322, a third transmission gate including transistors 323 and 324, and fourth transmission gate including transistors 325 and 326. Depending on the state of the differential input signal, the transparent latch 307 either operates in a tracking mode or in a locking mode.

Figure 12:
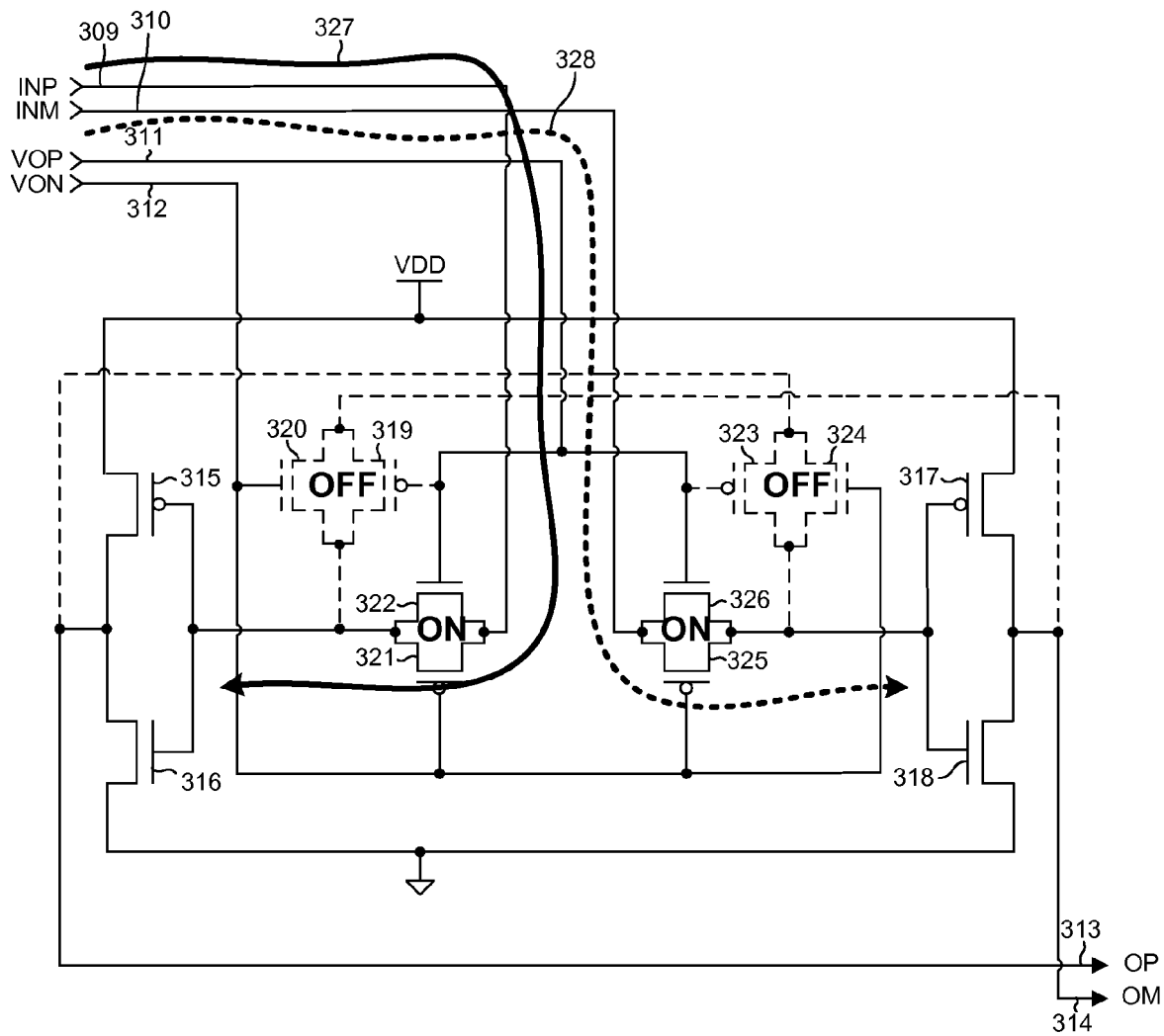
FIG. 12 is a diagram that shows operation of the latch of FIG. 11 in the tracking mode.

FIG. 12 is a diagram of operation of latch 307 in the tracking mode. Arrow 327 shows the signal path from input lead 309 to the input of the inverter 315, 316. Arrow 328 shows the signal path from input lead 310 to the input of the inverter 317, 318. The differential output signal tracks the differential input signal.

Figure 13:
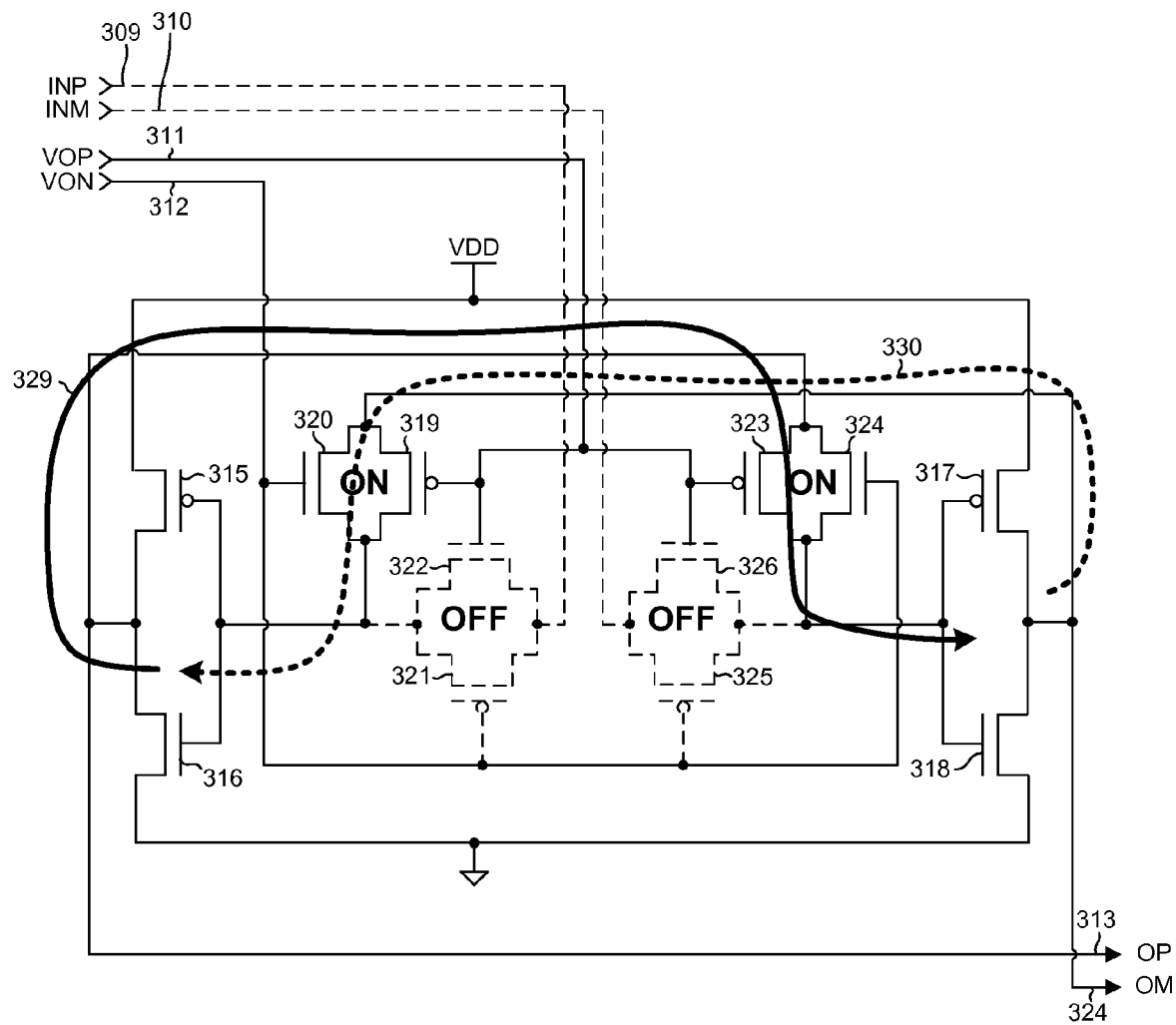
FIG. 13 is a diagram that shows operation of the latch of FIG. 11 in the locking mode.

FIG. 13 is a diagram of operation of latch 307 in the locking mode. Arrows 329 and 330 illustrate the signal path from the output of the first inverter 315, 316 to the input of the second inverter 317, 318, and from the output of the second inverter 317, 318 to the input of the first inverter 315, 316. The latch is locked due to the cross-coupling of the inverters.

Figure 14:
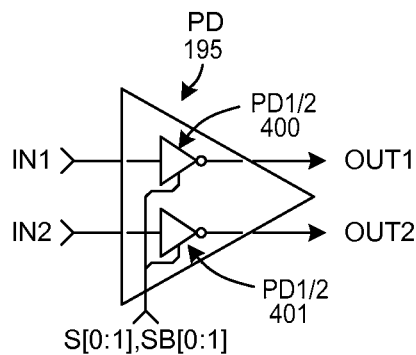
FIG. 14 is a high-level diagram of one of the programmable drivers of the programmable delay lines in the LO generation and distribution circuitry of FIG. 6.

FIG. 14 is a high-level diagram of one of the programmable drivers, programmable driver 195. Programmable driver 195 includes two digitally-controllable inverting circuits 400 and 401 connected as illustrated.

Figure 15:
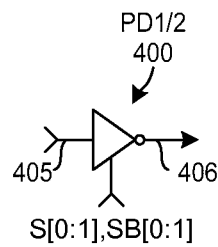
FIG. 15 is a diagram of one of the drivers within the programmable driver of FIG. 14.

FIG. 15 is a diagram of one of the two digitally-controllable inverting circuits, circuit 400.

Figure 16:
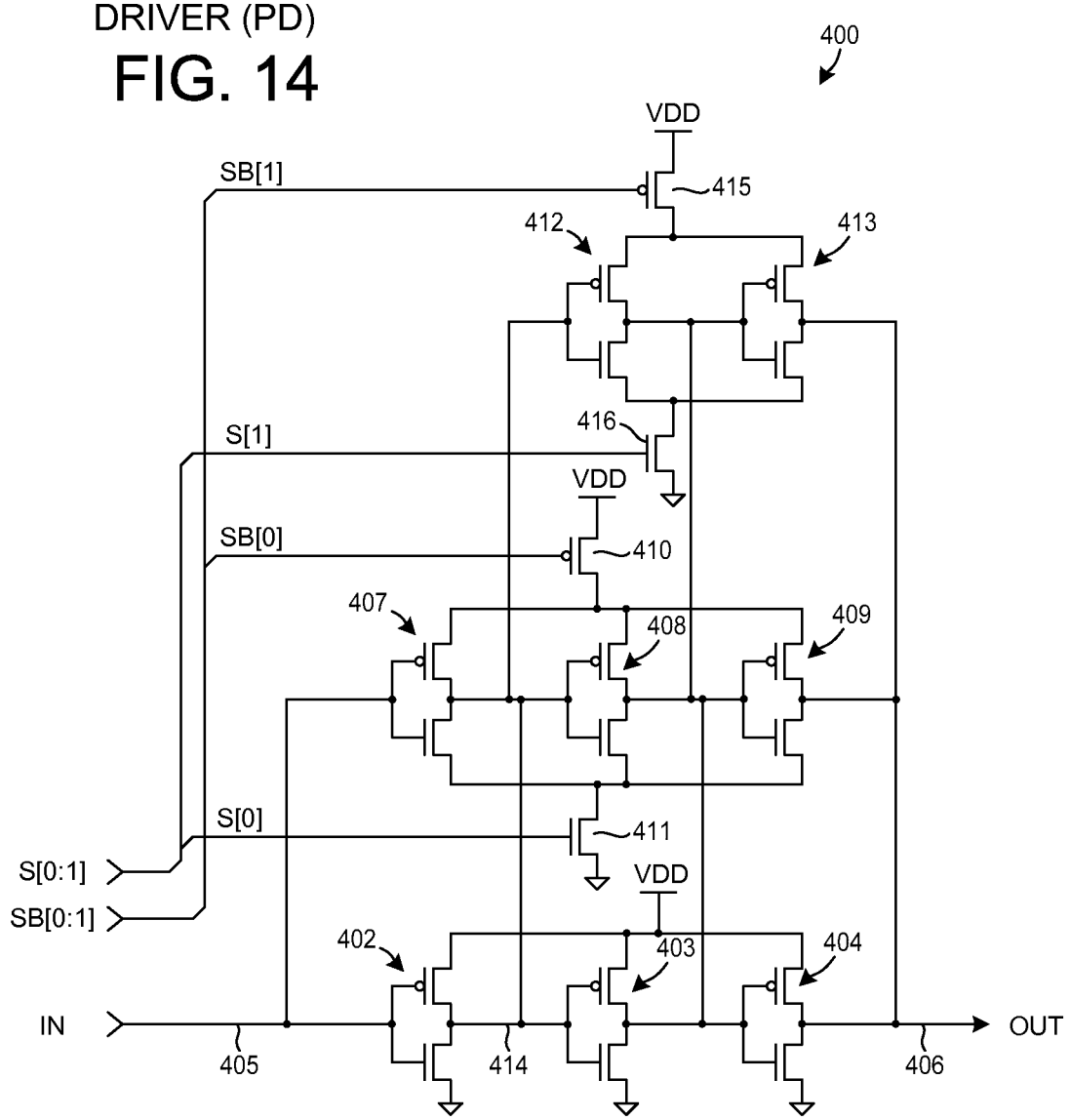
FIG. 16 is a circuit diagram of the driver of FIG. 15.

FIG. 16 is a diagram of the digitally-controllable inverting circuit 400 of FIG. 15. The circuit includes a chain of three inverters 402-404 between the input lead 405 and the output lead 406. In addition, the circuit includes a second set of three inverters 407-409 that are connected as a chain between input lead 405 and output lead 406, but this second set of inverters can be enabled or disabled via transistors 410 and 411 to increase or decrease the drive strength of the overall circuit. To enable this second set of three inverters, digital signal SB[0] is made to be a digital logic low and digital signal S[0] is made to be a digital logic high. In addition, the circuit includes a third set of two inverters 412 and 413 that are connected as a non-inverting chain between node 414 at the input of inverter 403 and the output lead 406. To enable this third set of two inverters, digital signal SB[1] is made to be a digital logic low to turn on transistor 415 and digital signal S[1] is made to be a digital logic high to enable transistor 416. Enabling the third set of two inverters increases the drive strength of the overall circuit.

Figure 1:
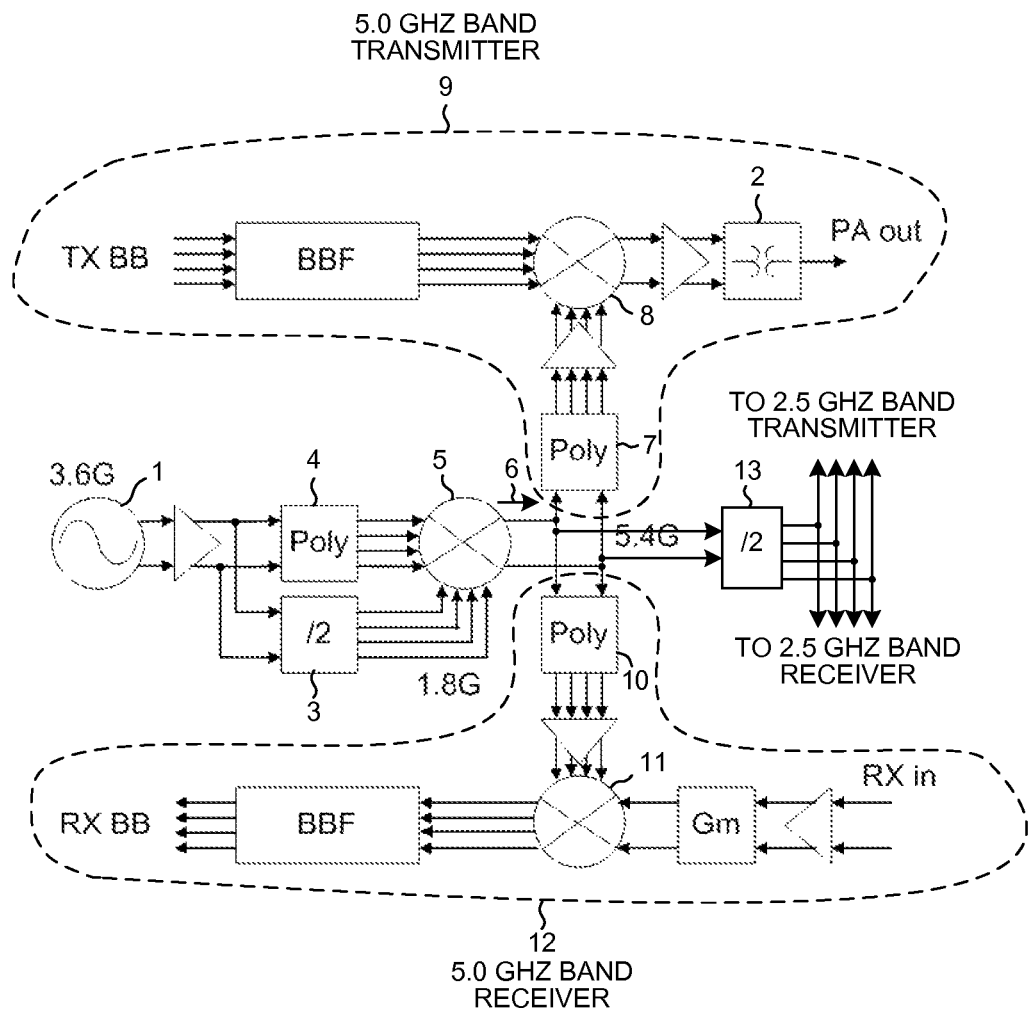
FIG. 1 (Prior Art) is a diagram of an offset LO architecture for generating local oscillator signals for a multi-band transceiver.
Figure 2:
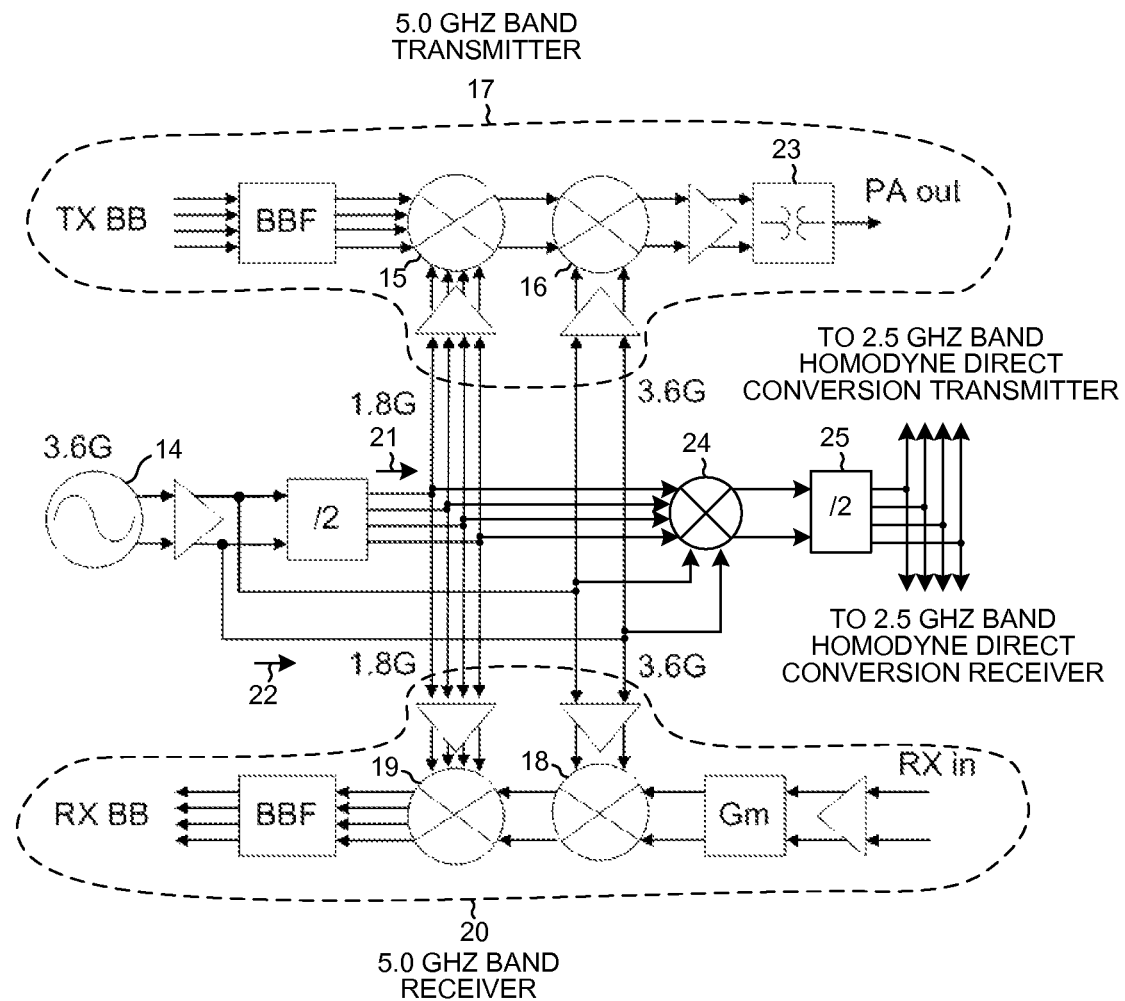
FIG. 2 (Prior Art) is a diagram of a heterodyne LO architecture for generating local oscillator signals for a multi-band transceiver.

FIG. 17 is a table that compares the amount of integrated circuit area required to implement the offset LO architecture of FIG. 1, the heterodyne LO architecture of FIG. 2, and the embodiment of FIG. 6.

FIG. 18 is a table that compares current consumption for the offset LO architecture of FIG. 1, the heterodyne LO architecture of FIG. 2, and the embodiment of FIG. 6.

Figure 19:
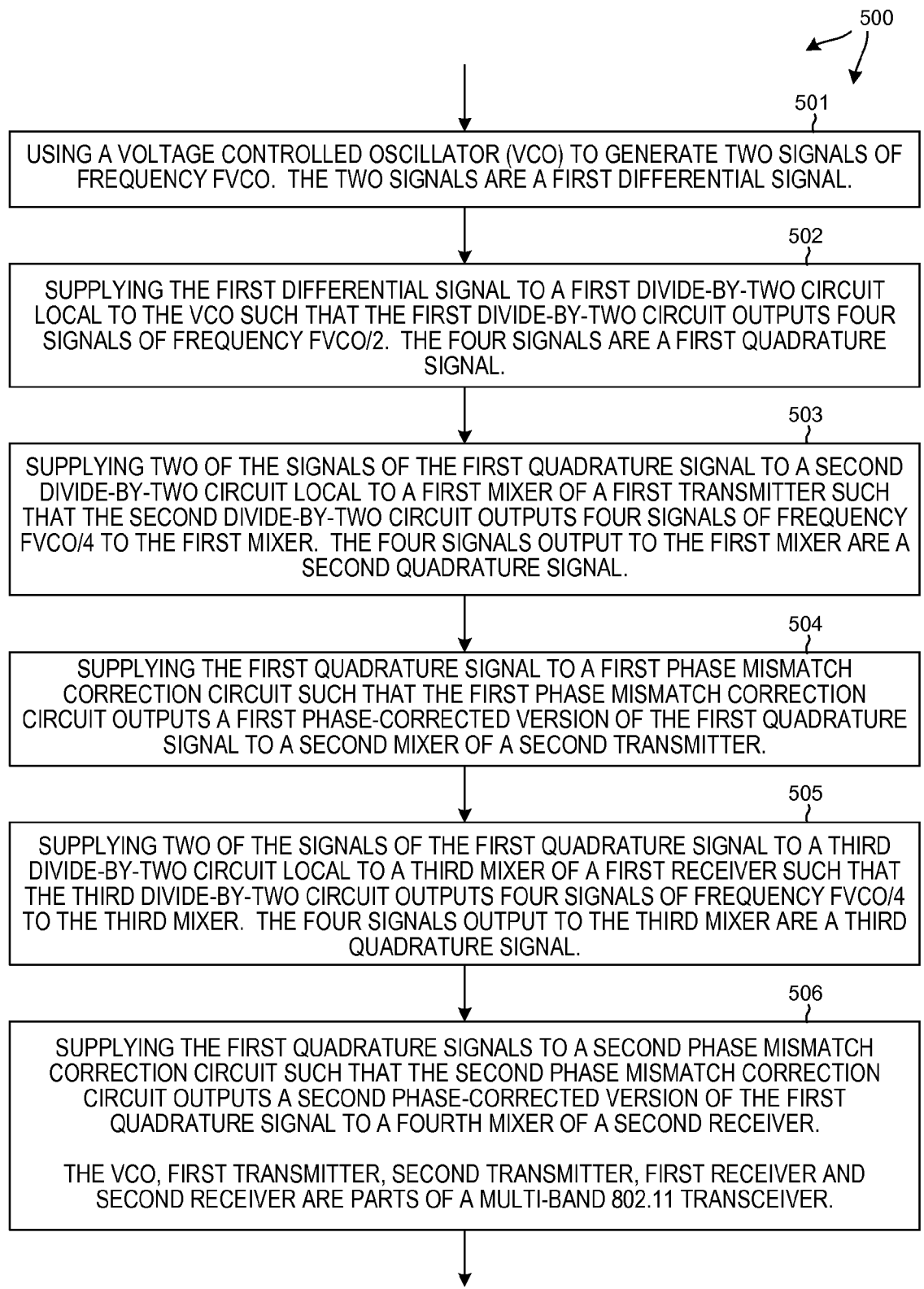
FIG. 19 is a flowchart of a method 500 in accordance with one novel aspect.

FIG. 19 is a flowchart of a method 500 of generating and distributing local oscillator signals in accordance with one novel aspect. In a first step (step 501), a VCO is used to generate a first differential signal of frequency FVCO. In one example, the first differential signal is signal 158 of FIG. 6.

In a second step (step 502), the first differential signal is supplied to a first divide-by-two circuit local to the VCO such that the first divide-by-two circuit outputs a first quadrature signal of frequency FVCO/2. In one example, the first quadrature signal of frequency FVCO/2 is signal 160 of FIG. 6.

In a third step (step 503), two of the four component signals of the first quadrature signal are supplied to a second divide-by-two circuit local to a first mixer of a first transmitter such that the second divide-by-two circuit outputs a second quadrature signal of frequency FVCO/4 to the first mixer. In one example, the second divide-by-two circuit is divider 170 of FIG. 6 and the first transmitter is transmitter 104 of FIG. 6.

In a fourth step (step 504), the first quadrature signal is supplied to a first phase mismatch correction circuit such that the first phase mismatch correction circuit outputs a first phase-corrected version of the first quadrature signal to a second mixer of a second transmitter. In one example, the first phase mismatch correction circuit is correction circuitry 195-198 and 190-193 and the first phase-corrected version of the first quadrature signal is signal 130 of FIG. 6. In this example, the second transmitter is transmitter 105.

In a fifth step (step 505), two of the four component signals of the first quadrature signal are supplied to a third divide-by-two circuit local to a third mixer of a first receiver such that the third divide-by-two circuit outputs a third quadrature signal of frequency FVCO/4 to the third mixer. In one example, the third divide-by-two circuit is divider 117 of FIG. 6. In this example, the first receiver is receiver 106.

In a sixth step (step 506), the first quadrature signal is supplied to a second phase mismatch correction circuit such that the second phase mismatch correction circuit outputs a second phase corrected version of the first quadrature signal to a fourth mixer of a second receiver. In one example, the second phase mismatch correction circuit is circuitry 199-202 and 203-206. In this example, the second receiver is receiver 107. The first transmitter, second transmitter, first receiver, and second receiver are parts of a multi-band 802.11 transceiver.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In one example, memory 231 of FIG. 3 is a processor-readable medium that stores a set of processor-executable instructions. When processor 151 executes this set of instructions, the processor 151 is made to control the RF transceiver integrated circuit 102 via serial bus 148 such that: 1) in a first mode two of the four component signals of quadrature signal 160 of frequency FVCO/2 are communicated a distance of more than one hundred microns from divide-by-two circuit 159 to divide-by-two circuit 170 such that divide-by-two circuit 170 supplies the quadrature signal 121 of frequency FVCO/4 to mixer 115, and 2) in a second mode all four of the component signals of quadrature signal 160 of frequency FVCO/2 are communicated a distance of more than one hundred microns from divide-by-two circuit 159 through phase mismatch correction circuitry 190-193,195-198 to mixer 125. The processor 151 controls the drivers in the signal paths such that signals are only supplied to the mixer of the transmitter that is being used. Generally either transmitter 104 is being used, or transmitter 105 is being used, but both transmitters 104 and 105 are not used simultaneously. In addition, the processor executes instructions that cause the processor to detect I/Q phase mismatch conditions using test loop back connection 235 and receiver 107 and to control the phase mismatch correction circuitry to eliminate or reduce I/Q phase mismatch in the four components of the quadrature signal 130 as supplied to mixer 125.

Although certain specific embodiments are described above for instructional purposes, the teachings of this patent document have general applicability and are not limited to the specific embodiments described above. Although the LO generation and distribution architecture described above has special applicability to multi-band IEEE802.11 transceivers, it is not limited thereto and has general applicability. Accordingly, various modifications, adaptations, and combinations of the various features of the described specific embodiments can be practiced without departing from the scope of the claims that are set forth below.

What is claimed is:

1. A method comprising:
   (a) using a Voltage Controlled Oscillator (VCO) to generate two signals of frequency FVCO, wherein the two signals together are a first differential signal;
   (b) supplying the first differential signal to a first divide-by-two circuit local to the VCO such that the first divide-by-two circuit outputs four signals of frequency FVCO/2, wherein the four signals together are a first quadrature signal;
   (c) supplying two of the four signals of the first quadrature signal to a second divide-by-two circuit local to a first mixer of a first device such that the second divide-by-two circuit outputs four signals of frequency FVCO/4 to the first mixer, wherein the four signals output to the first mixer together are a second quadrature signal, wherein the first device is taken from the group consisting of: a direct conversion transmitter and a direct conversion receiver; and
   (d) supplying the first quadrature signal to a first phase mismatch correction circuit such that the first phase mismatch correction circuit outputs a first phase-corrected version of the first quadrature signal to a second mixer of a second device, wherein the second device is taken from the group consisting of: a direct conversion transmitter and a direct conversion receiver, and wherein the VCO, the first divide-by-two circuit, the second divide-by-two circuit, the first device, the first phase mismatch correction circuit, and the second device are all parts of an integrated circuit.

2. The method of claim 1, further comprising:
   (e) supplying two of the four signals of the first quadrature signal to a third divide-by-two circuit local to a third mixer of a third device such that the third divide-by-two circuit outputs four signals of frequency FVCO/4 to the third mixer, wherein the four signals output to the third mixer together are a third quadrature signal, wherein the third device is a direct conversion device and is taken from the group consisting of: a transmitter and a receiver; and
   (f) supplying the first quadrature signal to a second phase mismatch correction circuit such that the second phase mismatch correction circuit outputs a second phase-corrected version of the first quadrature signal to a fourth mixer of a fourth device, wherein the fourth device is a direct conversion device and is taken from the group consisting of: a transmitter and a receiver, and wherein the third divide-by-two circuit, the third device, the second phase mismatch correction circuit and the fourth device are also parts of the integrated circuit.

3. The method of claim 1, wherein the first device is a first transmitter adapted to transmit in a first frequency band, wherein the second device is a second transmitter adapted to transmit in a second frequency band, and wherein the first frequency band is a lower frequency band than the second frequency band.

4. The method of claim 1, wherein the first device is a first receiver adapted to receive in a first frequency band, wherein the second device is a second receiver adapted to receive in a second frequency band, and wherein the first frequency band is a lower frequency band than the second frequency band.

5. The method of claim 1, wherein the first device is a first transmitter that is operable in compliance with an IEEE 802.11b/g standard, wherein the second device is a second transmitter that is operable in compliance with an IEEE 802.11a standard.

6. The method of claim 1, wherein the first device is a first receiver that is operable in compliance with an IEEE 802.11b/g standard, wherein the second device is a second receiver that is operable in compliance with an IEEE 802.11a standard.

7. The method of claim 1, wherein the supplying of the two of the four signals in (c) to the second divide-by-two circuit involves supplying the two of the four signals through a phase mismatch correction circuit.

8. The method of claim 2, further comprising:
(g) providing an on-chip loop back signal path from the second device to the fourth device and using the on-chip loop back signal path in a phase mismatch correction process.

9. An apparatus comprising:
a Voltage Controlled Oscillator (VCO) that is a part of a Phase-Locked Loop (PLL), wherein the VCO outputs a differential VCO output signal of frequency FVCO;
a first divide-by-two circuit local to the VCO, wherein the first divide-by-two circuit is coupled to receive the differential VCO output signal and to output a quadrature signal of frequency FVCO/2, wherein the quadrature signal comprises four component signals each having a frequency of FVCO/2;
a first mixer that is a part of a first device, wherein the first device is a direct conversion device;
a second divide-by-two circuit local to the first mixer, wherein the second divide-by-two circuit is coupled to receive two of the four component signals of the quadrature signal of frequency FVCO/2, and wherein the second divide-by-two circuit is coupled to supply a quadrature signal of frequency FVCO/4 to the first mixer;
a second mixer that is a part of a second device, wherein the second device is a direct conversion device; and
a first phase mismatch correction circuit coupled to receive the quadrature signal of frequency FVCO/2, wherein the first phase mismatch correction circuit is coupled to supply a first phase-corrected version of the quadrature signal of frequency FVCO/2 to the second mixer.

10. The apparatus of claim 9, wherein the first device is a device taken from the group consisting of: a transmitter adapted to transmit in a first frequency band and a receiver adapted to receive in the first frequency band, and wherein the second device is a device taken from the group consisting of: a transmitter adapted to transmit in a second frequency band and a receiver adapted to receive in the second frequency band.

11. The apparatus of claim 9, wherein the first device is a device taken from the group consisting of: a transmitter adapted to transmit in compliance with a first IEEE802.11 standard, and a receiver adapted to transmit in compliance with the first IEEE802.11 standard, and wherein the second device is a device taken from the group consisting of: a transmitter adapted to transmit in compliance with a second IEEE802.11 standard, and a receiver adapted to receive in compliance with the second IEEE802.11 standard.

12. The apparatus of claim 9, wherein the first divide-by-two circuit is located less than fifty microns away from the VCO, wherein the second divide-by-two circuit is located less than fifty microns away from the first mixer, wherein the first divide-by-two circuit is located more than one hundred microns away from the first mixer, and wherein the first divide-by-two circuit is located more than one hundred microns away from the second mixer.

13. The apparatus of claim 9, further comprising:
a third mixer that is a part of a third device, wherein the third device is a direct conversion device;
a third divide-by-two circuit local to the third mixer, wherein the third divide-by-two circuit is coupled to receive two of the four component signals of the quadrature signal of frequency FVCO/2, and wherein the third divide-by-two circuit is coupled to supply a quadrature signal of frequency FVCO/4 to the third mixer;
a fourth mixer that is a part of a fourth device, wherein the fourth device is a direct conversion device; and
a second phase mismatch correction circuit coupled to receive the quadrature signal of frequency FVCO/2, wherein the second phase mismatch correction circuit is coupled to supply a second phase-corrected version of the quadrature signal of frequency FVCO/2 to the fourth mixer.

14. An apparatus comprising:
a Voltage Controlled Oscillator (VCO) that outputs a VCO output signal of frequency FVCO;
a first divide-by-two circuit that is located less than fifty microns from the VCO, wherein the first divide-by-two circuit is coupled to receive the VCO output signal and to output a quadrature signal of frequency FVCO/2, wherein the quadrature signal comprises four component signals each having a frequency of FVCO/2;
a first device that is located more than one hundred microns away from the first divide-by-two circuit, wherein the first device is a direct conversion device and is taken from the group consisting of: a transmitter and a receiver;
a second divide-by-two circuit that is located less than fifty microns away from the first device;
a second device that is located more than one hundred microns away from the first divide-by-two circuit, wherein the second device is a direct conversion device and is taken from the group consisting of: a transmitter and a receiver;
means for communicating two of the four component signals of frequency FVCO/2 from the first divide-by-two circuit to the second divide-by-two circuit such that the second divide-by-two circuit supplies a quadrature signal of frequency FVCO/4 to the first device, and wherein the means is also for communicating the quadrature signal of frequency FVCO/2 from the first divide-by-two circuit to the second device.

15. The apparatus of claim 14, wherein the means communicates the quadrature signal of frequency FVCO/2 through a phase mismatch correction circuit to the second device.

16. The apparatus of claim 14, wherein the means communicates two of the four component signals of frequency FVCO/2 to the second divide-by-two circuit through a phase mismatch correction circuit.

17. The apparatus of claim 14, wherein the apparatus is a multi-band IEEE802.11 transceiver.

18. A non-transitory processor-readable medium storing a set of processor-executable instructions, wherein execution of the set of processor-executable instructions by a processor is for:
(a) controlling a transceiver such that in a first mode a Voltage Controlled Oscillator (VCO) output signal of frequency FVCO is divided by two by a first divide-by-two circuit thereby generating a quadrature signal of frequency FVCO/2, and such that two component signals of the quadrature signal are communicated a distance of more than one hundred microns from the first divide-by-two circuit to a second divide-by-two circuit such that the second divide-by-two circuit supplies a quadrature signal of frequency FVCO/4 to a first device, wherein the first device is a direct conversion device; and (b) controlling the transceiver such that in a second mode the VCO output signal of frequency FVCO is divided by two by the first divide-by-two circuit thereby generating the quadrature signal of frequency FVCO/2, and such that the quadrature signal of frequency FVCO/2 is communicated a distance of more than one hundred microns from the first divide-by-two circuit and through a phase mismatch correction circuit to a second device, wherein the second device is a direct conversion device.

19. The non-transitory processor-readable medium of claim 18, wherein the controlling of (b) involves controlling the phase mismatch correction circuit.

20. The non-transitory processor-readable medium of claim 18, wherein the controlling of (a) involves controlling a first programmable driver in a signal path of the two component signals between the first divide-by-two circuit and the second divide-by-two circuit, and wherein the controlling of (b) involves controlling a second programmable driver in a signal path of the quadrature signal of frequency FVCO/2 between the first divide-by-two circuit and the phase mismatch correction circuit.

21. An integrated multi-band transceiver comprising:
a Voltage Controlled Oscillator (VCO) that is a part of a Phase-Locked Loop (PLL), wherein the VCO outputs a differential VCO output signal of frequency FVCO;
a first divide-by-two circuit local to the VCO, wherein the first divide-by-two circuit is coupled to receive the differential VCO output signal and to output a quadrature signal of frequency FVCO/2, wherein the quadrature signal comprises four component signals each having a frequency of FVCO/2;
a first direct conversion transmitter that includes a first mixer, wherein the first direct conversion transmitter is adapted to transmit in a band located at about FVCO/4;
a second divide-by-two circuit local to the first mixer, wherein the second divide-by-two circuit is coupled to receive two of the four component signals of the quadrature signal of frequency FVCO/2, and wherein the second divide-by-two circuit is coupled to supply a quadrature signal of frequency FVCO/4 to the first mixer;
a second direct conversion transmitter that includes a second mixer, wherein the second direct conversion transmitter is adapted to transmit in a band located at about FVCO/2;
a first phase mismatch correction circuit coupled to receive the quadrature signal of frequency FVCO/2, wherein the first phase mismatch correction circuit is coupled to supply a first phase-corrected version of the quadrature signal of frequency FVCO/2 to the second mixer;
a first direct conversion receiver that includes a third mixer, wherein the first direct conversion receiver is adapted to receive in a band located at about FVCO/4;
a third divide-by-two circuit local to the third mixer, wherein the third divide-by-two circuit is coupled to receive two of the four component signals of the quadrature signal of frequency FVCO/2, and wherein the third divide-by-two circuit is coupled to supply a quadrature signal of frequency FVCO/4 to the third mixer;
a second direct conversion receiver that includes a fourth mixer, wherein the second direct conversion receiver is adapted to receive in a band located at about FVCO/2;
a second phase mismatch correction circuit coupled to receive the quadrature signal of frequency FVCO/2, wherein the second phase mismatch correction circuit is coupled to supply a second phase-corrected version of the quadrature signal of frequency FVCO/2 to the fourth mixer;
a first internal loopback test connection usable in a phase correction process to supply a signal output by the first direct conversion transmitter to the first direct conversion receiver; and
a second internal loopback test connection usable in phase correction process to supply a signal output by the second direct conversion transmitter to the second direct conversion receiver.

22. The integrated multi-band transceiver of claim 21, wherein each of the first, second, third and fourth mixers is located more than one hundred microns away from the first divide-by-two circuit.

23. The integrated multi-band transceiver of claim 21, wherein FVCO is approximately 10 GHz.

24. The integrated multi-band transceiver of claim 21, wherein the multi-band transceiver is a IEEE802.11 transceiver.

* * * * *